(12) United States Patent
Nishimura et al.

(10) Patent No.: US 10,225,918 B2
(45) Date of Patent: Mar. 5, 2019

(54) EXTREME ULTRAVIOLET LIGHT GENERATING APPARATUS

(71) Applicant: GIGAPHOTON INC., Tochigi (JP)

(72) Inventors: Yuichi Nishimura, Oyama (JP); Takayuki Yabu, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/055,274

(22) Filed: Aug. 6, 2018

(65) Prior Publication Data

US 2018/0352641 A1    Dec. 6, 2018

Related U.S. Application Data

(63) Continuation of application No. PCT/JP2017/005996, filed on Feb. 17, 2017.

(30) Foreign Application Priority Data

Mar. 8, 2016   (WO) .................. PCT/JP2016/057196

(51) Int. Cl.
*G01J 1/42*     (2006.01)
*G03F 7/20*     (2006.01)
*H05G 2/00*     (2006.01)

(52) U.S. Cl.
CPC ............ *H05G 2/008* (2013.01); *G01J 1/4209* (2013.01); *G01J 1/429* (2013.01); *G01J 1/4257* (2013.01);
(Continued)

(58) Field of Classification Search
CPC ........ G01J 1/4209; G01J 1/4257; G01J 1/429; G03F 7/70033; H05G 2/003; H05G 2/006; H05G 2/008
See application file for complete search history.

(56) References Cited

U.S. PATENT DOCUMENTS

2006/0131515 A1   6/2006   Partlo et al.
2011/0220816 A1   9/2011   Kakizaki et al.
(Continued)

FOREIGN PATENT DOCUMENTS

JP   2004-140390 A    5/2004
JP   2007-528607 A    10/2007
(Continued)

OTHER PUBLICATIONS

International Search Report issued in PCT/JP2017/005996; dated Apr. 18, 2017.
(Continued)

*Primary Examiner* — Mark R Gaworecki
(74) *Attorney, Agent, or Firm* — Studebaker & Brackett PC

(57) ABSTRACT

An extreme ultraviolet light generating apparatus moves a generation position of extreme ultraviolet light based on an instruction from an external device and includes a chamber in which a target fed therein is irradiated with laser light so that the extreme ultraviolet light is generated from the target; a target feeder configured to output and feed the target into the chamber; a condensing mirror configured to condense the laser light on the target fed into the chamber; a stage configured to regulate a position of the target feeder; a manipulator configured to regulate a position of the condensing mirror; and a control unit configured to be able to control at least one of the stage, the manipulator, and a radiation timing of the laser light to the target, in a feedforward method, when the generation position is moved during generation of the extreme ultraviolet light.

14 Claims, 20 Drawing Sheets

(52) U.S. Cl.
CPC ......... *G03F 7/70033* (2013.01); *H05G 2/003* (2013.01); *H05G 2/006* (2013.01)

(56) References Cited

U.S. PATENT DOCUMENTS

| | | |
|---|---|---|
| 2012/0175533 A1 | 7/2012 | Moriya et al. |
| 2012/0305809 A1 | 12/2012 | Moriya et al. |
| 2013/0043401 A1 | 2/2013 | Graham et al. |
| 2013/0119232 A1 | 5/2013 | Moriya et al. |
| 2014/0091239 A1 | 4/2014 | van der Burgt et al. |
| 2014/0111635 A1 | 4/2014 | Suzuki et al. |

FOREIGN PATENT DOCUMENTS

| | | |
|---|---|---|
| JP | 2010-147138 A | 7/2010 |
| JP | 2011-210704 A | 10/2011 |
| JP | 2013-012465 A | 1/2013 |
| JP | 2013-105725 A | 5/2013 |
| JP | 2014-086523 A | 5/2014 |
| JP | 2014-531743 A | 11/2014 |
| JP | 2015-015251 A | 1/2015 |
| JP | 2015-532505 A | 11/2015 |

OTHER PUBLICATIONS

International Preliminary Report on Patentability issued in PCT/JP2017/005996; dated Sep. 11, 2018.

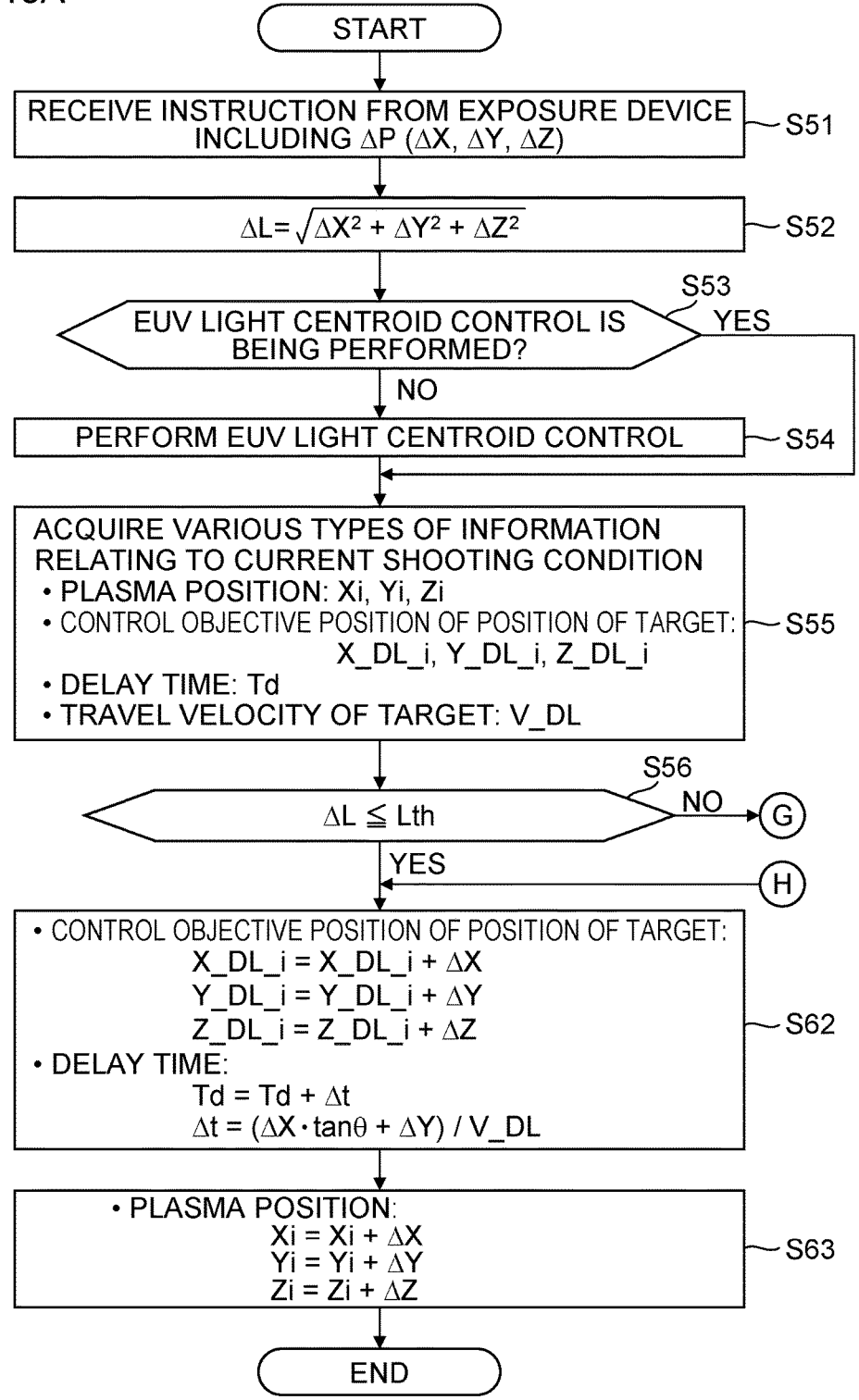

EXTREME ULTRAVIOLET LIGHT GENERATING APPARATUS

CROSS-REFERENCE TO RELATED APPLICATIONS

The present application is a continuation application of International Application No. PCT/JP2017/005996 filed on Feb. 17, 2017 claiming the priority to International Application No. PCT/JP2016/057196 filed on Mar. 8, 2016. Each of the above applications is incorporated herein by reference in its entirety.

BACKGROUND

1. Technical Field

The present disclosure relates to an extreme ultraviolet light generating apparatus.

2. Related Art

In recent years, along with microfabrication in a semiconductor process, fine transfer patterns in photolithography of the semiconductor process are being developed rapidly. In the next generation, microfabrication of 20 nm or smaller will be required. Accordingly, it is desirable to develop an exposure device in which an extreme ultraviolet (EUV) light generating apparatus that generates extreme ultraviolet (EUV) light having a wavelength of about 13 nm and reduced projection reflection optics are combined.

As EUV light generating apparatuses, three types of apparatuses are proposed, namely an LPP (Laser Produced Plasma)-type apparatus that uses plasma generated when a target is irradiated with laser light, a DPP (Discharge Produced Plasma)-type apparatus that uses plasma generated by discharging, and an SR (Synchrotron Radiation)-type apparatus that uses orbital radiation light.

CITATION LIST

Patent Literature

Patent Literature 1: Japanese Patent Application Laid-Open No. 2013-012465
Patent Literature 2: Japanese Patent Application Laid-Open No. 2011-210704

SUMMARY

In an extreme ultraviolet light generating apparatus according to an aspect of the present disclosure, a generation position of extreme ultraviolet light is moved based on an instruction from an external device. The apparatus includes a chamber, a target feeder, a condensing mirror, a stage, a manipulator, and a control unit. In the chamber, the target fed therein is irradiated with laser light, whereby the extreme ultraviolet light is generated from the target. The target feeder is configured to output the target and feed the target into the chamber. The condensing mirror is configured to condense the laser light on the target fed into the chamber. The stage is configured to regulate the position of the target feeder. The manipulator is configured to regulate the position of the condensing mirror. The control unit is configured to be able to control at least one of the stage, the manipulator, and the radiation timing of the laser light to the target, in a feedforward method, when the generation position is moved during generation of the extreme ultraviolet light.

BRIEF DESCRIPTION OF THE DRAWINGS

Some embodiments of the present disclosure will be described below as just examples with reference to the accompanying drawings.

FIGS. 19A and 19B are flowcharts of an EUV light moving process performed by a control unit according to a fourth embodiment.

EMBODIMENTS

Figure 1:
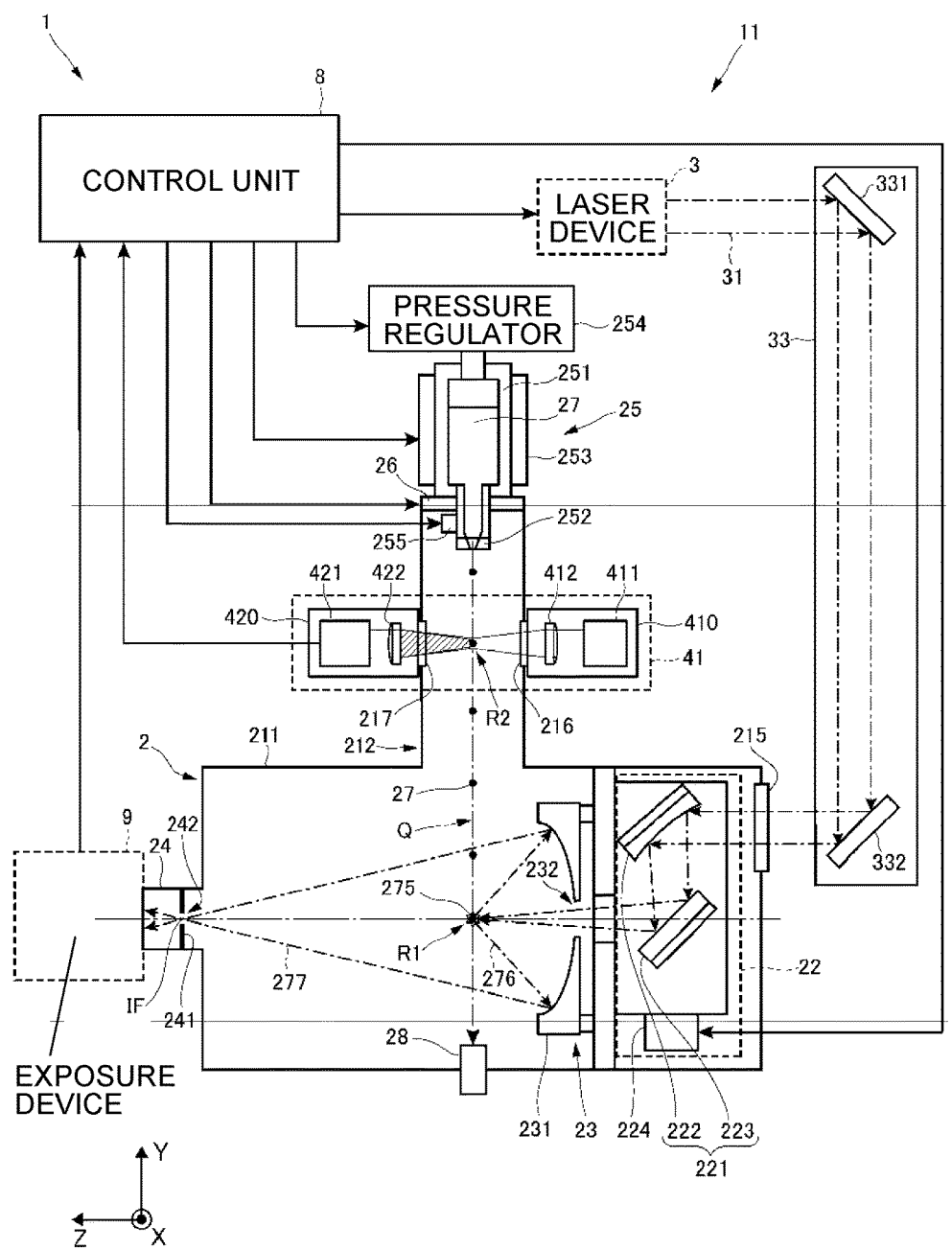
FIG. 1 is a diagram for explaining a configuration of an EUV light generating apparatus of a comparative example.

<Contents>
1. Terms
2. Problem
   2.1 Configuration of comparative example
   2.2 Operation of comparative example
   2.3 Problem
3. First embodiment
   3.1 Configuration
   3.2 Operation
   3.3 Effect
4. Second Embodiment
   4.1 Configuration
   4.2 Operation
   4.3 Effect
5. Third Embodiment
   5.1 Configuration
   5.2 Operation
   5.3 Effect
6. Fourth Embodiment
7 Fifth embodiment
   7.1 Configuration
   7.2 Operation
   7.3 Effect
8. Others Hereinafter, embodiments of the present disclosure will be described in detail with reference to the drawings. The embodiments described below illustrate some examples of the present disclosure, and do not limit the contents of the present disclosure. All of the configurations and the operations described in the embodiments are not always indispensable as configurations and operations of the present disclosure. The same constituent elements are denoted by the same reference signs, and overlapping description is omitted.

1. Terms

A "target" is an object to be irradiated with laser light introduced into a chamber. The target irradiated with laser light is made into plasma and emits light including EUV light.

A "plasma generation region" is a predetermined region in the chamber. The plasma generation region is a region where a target output into the chamber is irradiated with laser light, and the target is made into plasma.

A "target trajectory" is a path on which a target output into the chamber travels. The target trajectory crosses an optical path of the laser light introduced into the chamber in the plasma generation region.

An "optical path axis" is an axis passing through a center of a beam cross section of laser light along a travel direction of the laser light.

An "optical path" is a path on which laser light passes. The optical path includes an optical path axis.

A "Z axis direction" is a travel direction of laser light when the laser light introduced into the chamber travels toward a plasma generation region. The Z axis direction may be almost identical to a direction that the EUV light generating apparatus outputs EUV light.

A "Y axis direction" is a direction opposite to the direction that a target feeder outputs a target into a chamber. The Y axis direction is a direction vertical to an X axis direction and the Z axis direction.

The "X axis direction" is a direction vertical to the Y axis direction and the Z axis direction.

2. Problem

An EUV light generating apparatus 1 of a comparative example will be described with use of FIGS. 1 to 3.

The EUV light generating apparatus 1 of the comparative example is an LPP-type EUV light generating apparatus. The EUV light generating apparatus 1 is used together with at least one laser device 3.

A system including the EUV light generating apparatus 1 and the laser device 3 is also referred to as an EUV light generation system 11.

The EUV light generating apparatus 1 generates plasma 275 of a target 27 by irradiating the target 27 with at least one unit of pulse laser light 31 output from the laser device 3. The generated plasma 275 emits radiation light 276. The radiation light 276 includes light of various wavelengths, besides EUV light 277. The EUV light generating apparatus 1 collects the EUV light 277 included in the radiation light 276, and outputs it to an exposure device 9.

In this way, the EUV light generating apparatus 1 can generate the EUV light 277.

One target 27 may be irradiated with a plurality of units of pulse laser light 31. In that case, the laser device 3 includes a plurality of laser devices 3 that output units of pulse laser light 31 of different wavelengths. The EUV light generating apparatus 1 controls an output timing of each unit of pulse laser light 31 such that one target 27 is irradiated with each unit of pulse laser light 31 output from each of the laser devices 3.

[2.1 Configuration of Comparative Example]

FIG. 1 is a diagram for explaining a configuration of the EUV light generating apparatus 1 of the comparative example. FIG. 2 illustrates an arrangement of an illumination unit 410 and a detection unit 420 illustrated in FIG. 1.

The EUV light generating apparatus 1 of the comparative example includes a chamber 2, a laser light condensing optical system 22, an EUV light condensing optical system 23, a connecting section 24, and a laser light transmission optical system 33. In addition, the EUV light generating apparatus 1 of the comparative example also includes a target feeder 25, a stage 26, a target recovery device 28, a target detection sensor 41, and a control unit 8.

The chamber 2 is a container in which the target 27 fed therein is irradiated with the pulse laser light 31 whereby plasma 275 is generated from the target 27, and the EUV light 277 is generated.

A wall 211 of the chamber 2 forms an internal space of the chamber 2, and isolates the internal space of the chamber 2 from the external environment.

The wall 211 has a window 215 for introducing the pulse laser light 31 into the chamber 2.

The chamber 2 also includes a target feeding path 212 for feeding the target 27 into the chamber 2.

The laser light transmission optical system 33 is an optical system that introduces the pulse laser light 31, output from the laser device 3, into the chamber 2 via the window 215.

The laser light transmission optical system 33 is disposed outside the chamber 2.

The laser light transmission optical system 33 is disposed on the optical path of the pulse laser light 31 output from the laser device 3, between the laser device 3 and the window 215.

The laser light transmission optical system 33 includes a high reflective mirror 331 and a high reflective mirror 332.

Each of the high reflective mirrors 331 and 332 is mounted on a stage (not illustrated) for regulating at least one of the position and posture thereof. Operation of the stage on which the high reflective mirrors 331 and 332 are mounted is controlled by the control unit 8.

The laser light condensing optical system 22 is an optical system that focuses the pulse laser light 31, introduced into the chamber 2 via the window 215, on the plasma generation region R1.

The laser light condensing optical system 22 is disposed inside the chamber 2.

The laser light condensing optical system 22 is disposed on the optical path of the pulse laser light 31 passing through the window 215, between the window 215 and the plasma generation region R1.

The laser light condensing optical system 22 also includes a laser light condensing mirror 221 and a manipulator 224.

The laser light condensing mirror 221 reflects the pulse laser light 31, passing through the window 215, toward the plasma generation region R1. The laser light condensing mirror 221 focuses the reflected pulse laser light 31 on the plasma generation region R1.

The laser light condensing mirror 221 is mounted on the manipulator 224.

The laser light condensing mirror 221 includes an off-axis parabolic mirror 222 and a planar mirror 223.

The manipulator 224 is a mechanism for regulating the position of the laser light condensing mirror 221. The manipulator 224 is a mechanism for moving the laser light condensing mirror 221 in at least one of the X axis direction and the Y axis direction.

The manipulator 224 is a mechanism for regulating the position of the laser light condensing mirror 221 such that the target 27 is irradiated with the pulse laser light 31 in the plasma generation region R1.

Driving of the manipulator 224 is controlled by the control unit 8.

The manipulator 224 may regulate not only the position of the laser light condensing mirror 221 but also the posture thereof. The manipulator 224 may be a mechanism for moving the laser light condensing mirror 221 in the X axis direction and the Y axis direction as well as the Z axis direction.

The EUV light condensing optical system 23 is an optical system that collects the EUV light 277 included in the radiation light 276 and condenses it at the intermediate focusing point IF.

The EUV light condensing optical system 23 is disposed inside the chamber 2.

The EUV light condensing optical system 23 includes an EUV light condensing mirror 231.

The EUV light condensing mirror 231 selectively reflects the EUV light 277 from the radiation light 276 emitted from the plasma 275 in the plasma generation region R1. The EUV light condensing mirror 231 condenses the selectively reflected EUV light 277 at the intermediate focusing point IF positioned inside the connecting section 24.

The reflection surface of the EUV light condensing mirror 231 is formed of a multilayer reflection film in which molybdenum and silicon are alternately layered, for example.

The reflection surface of the EUV light condensing mirror 231 is formed of part of a spheroidal face having a first focus and a second focus, for example.

The EUV light condensing mirror 231 is disposed such that the first focus is positioned in the plasma generation region R1 and the second focus is positioned at the intermediate focusing point IF.

A through hole 232 is formed in the center portion of the EUV light condensing mirror 231.

The through hole 232 is a hole for allowing the pulse laser light 31, reflected by the laser light condensing mirror 221, to pass therethrough toward the plasma generation region R1.

The connecting section 24 is a connecting section between the chamber 2 and the exposure device 9.

The connecting section 24 includes a gate valve (not illustrated) for outputting the EUV light 277 condensed at the intermediate focusing point IF to the exposure device 9. The gate valve included in the connecting section 24 allows the inside of the chamber 2 and the inside of the exposure device 9 airtightly to communicate with each other or to be separated from each other.

The connecting section 24 has a wall 241 provided therein. An aperture 242 is formed in the wall 241. The aperture 242 is formed to be positioned at the intermediate focusing point IF.

The target feeder 25 is a device that melts the target 27 to be fed into the chamber 2, and outputs it as a form of a droplet toward the plasma generation region R1. The target feeder 25 is a device that outputs the target 27 in a so-called continuous jet method.

The target 27 fed by the target feeder 25 is made of a metallic material. The metallic material forming the target 27 is a material containing tin, terbium, gadolinium, or a combination of any two or more of them. It is preferable that the metallic material forming the target 27 is tin.

The target feeder 25 is mounted on a stage 26.

The target feeder 25 includes a tank 251, a nozzle 252, a heater 253, a pressure regulator 254, and a piezoelectric element 255.

Operation of the target feeder 25 is controlled by the control unit 8.

The stage 26 is a mechanism for regulating the position of the target feeder 25. The stage 26 is a mechanism for moving the target feeder 25 in at least one of the X axis direction and the Z axis direction.

The stage 26 is a mechanism for regulating the position of the target feeder 25 such that the target 27 output from the target feeder 25 is fed to the plasma generation region R1.

Driving of the stage 26 is controlled by the control unit 8.

The target recovery device 28 is a device that recovers the target 27 not irradiated with the pulse laser light 31, of the targets 27 output into the chamber 2.

The target recovery device 28 is provided on the wall 211 of the chamber 2 on the extended line of a target trajectory Q.

The target detection sensor 41 is a sensor that detects the target 27 passing through a target detection region R2.

The target detection region R2 is a predetermined region in the chamber 2, and is located at a predetermined position on the target trajectory Q between the target feeder 25 and the plasma generation region R1. This means that the target detection region R2 is a region through which the target 27 passes after the target 27 is output from the target feeder 25 and before the target 27 is irradiated with the pulse laser light 31.

The target detection sensor 41 includes the illumination unit 410 and the detection unit 420.

The illumination unit 410 and the detection unit 420 are connected with the wall 211 of the target feeding path 212 via the window 216 and the window 217, respectively.

The illumination unit 410 and the detection unit 420 are arranged to face each other over the target detection region R2 on the target trajectory Q.

The illumination unit 410 and the detection unit 420 are arranged such that the illumination optical axis of the illumination unit 410 and the detection optical axis of the detection unit 420 pass through the target detection region R2 almost coaxially as illustrated in FIG. 1. In addition, the illumination unit 410 and the detection unit 420 are arranged such that the illumination optical axis of the illumination unit 410 and the detection optical axis of the detection unit 420 are included in a plane substantially parallel to the XY plane and are inclined by a predetermined angle θ relative to the X axis, as illustrated in FIG. 2.

The predetermined angle θ is 0° or larger but 90° or smaller. When the predetermined angle θ is 0°, the illumination unit 410 and the detection unit 420 are disposed such that the illumination optical axis and the detection optical axis are substantially orthogonal to the target trajectory Q.

The illumination optical axis of the illumination unit 410 is an optical path axis of the illumination light output from the illumination unit 410 toward the target detection region R2. The detection optical axis of the detection unit 420 is an optical path axis of the illumination light detected by the detection unit 420, of the illumination light output from the illumination unit 410 toward the target detection region R2.

The illumination unit 410 outputs illumination light toward the target detection region R2 so as to illuminate the target 27 passing through the target detection region R2.

The illumination unit 410 includes a light source 411 and an illumination optical system 412.

The detection unit 420 detects the light intensity of the illumination light output to illuminate the target 27 passing through the target detection region R2, to thereby detect the target 27 passing through the target detection region R2.

The detection unit 420 includes an optical sensor 421 and a light receiving optical system 422.

The control unit 8 collectively controls the operation of respective constituent elements of the EUV light generation system 11 based on various types of instructions from the exposure device 9 that is an external device.

The control unit 8 controls the laser device 3, and controls an output of the pulse laser light 31 from the laser device 3.

The control unit 8 controls the target feeder 25, and controls an output of the target 27 from the target feeder 25.

The control unit 8 controls a stage (not illustrated) on which the high reflective mirrors 331 and 332 are mounted, and controls at least one of the position and the posture of each of the high reflective mirrors 331 and 332.

The control unit 8 controls the manipulator 224, and controls the position of the laser light condensing mirror 221.

The control unit 8 controls the stage 26, and controls the position of the target feeder 25.

The control unit 8 includes a computer in which hardware such as a processor and software such as a program module are combined. Information processing by software included in the control unit 8 is specifically realized by hardware included in the control unit 8.

[2.2 Operation of Comparative Example]

The control unit 8 controls the target feeder 25, and allows the target 27 to be output from the target feeder 25 toward the plasma generation region R1.

Specifically, the control unit 8 heats the temperature of the heater 253 of the target feeder 25 to a temperature of the melting point of the target 27 or higher to melt the solid target 27 contained in the tank 251 of the target feeder 25. In the case where the metallic material forming the target 27 is tin, as the melting point of tin is 232° C., the control unit 8 allows the heater 253 to heat at a temperature of 250° C. or higher but 290° C. or lower, for example.

The control unit 8 controls the pressure regulator 254 of the target feeder 25, and applies a predetermined pressure to the target 27 in the tank 251 such that the target 27 in the tank 251 is continuously output from the nozzle 252 at a predetermined velocity.

The control unit 8 vibrates the piezoelectric element 255 of the target feeder 25 with a predetermined waveform, and forms a target 27 in a droplet state by cutting the continuously-output target 27 in a predetermined cycle, and the control unit 8 outputs it from the nozzle 252 with a predetermined frequency.

The target 27 output into the chamber 2 travels on the target trajectory Q in a droplet form, and passes through the target detection region R2. The target 27, passing through the target detection region R2, is fed to the plasma generation region R1.

The target detection sensor 41 detects the timing that the target 27 passes through the target detection region R2.

Specifically, the light source 411 of the illumination unit 410 outputs illumination light toward the target detection region R2 via the illumination optical system 412 so as to illuminate the target 27 passing through the target detection region R2.

The optical sensor 421 of the detection unit 420 detects the illumination light output to the target detection region R2 via the light receiving optical system 422 to thereby detect the target 27 passing through the target detection region R2. The light intensity of the illumination light detected by the optical sensor 421 may be decreased each time the target 27 passes through the target detection region R2. The optical sensor 421 generates an output signal in response to a change in the light intensity of the detected illumination light, and transmits it to the control unit 8.

An output signal in response to a change in the light intensity of the illumination light detected by the optical sensor 421 is also referred to as a passage timing signal.

The control unit 8 receives a passage timing signal transmitted from the target detection sensor 41.

The control unit 8 determines that the timing when the passage timing signal becomes lower than a predetermined threshold is the timing when the target 27 passes through the target detection region R2. This means that the control unit 8 specifies the timing when the target 27 passes through the target detection region R2 based on the detection result by the target detection sensor 41.

The control unit 8 generates a target detection signal indicating that the target 27 has passed through the target detection region R2 at the timing when the passage timing signal becomes lower than a predetermined threshold.

The timing when the target 27 passes through the target detection region R2 is also referred to as a passage timing of the target detection region R2.

The control unit 8 transmits a trigger signal to the laser device 3 at a timing delayed by a delay time Td from the timing when the target detection signal is generated. This means that the control unit 8 allows the laser device 3 to output the pulse laser light 31 at the timing defined by adding the delay time Td to the passage timing of the target detection region R2.

The delay time Td is a time for causing the timing when the pulse laser light 31 is condensed on the plasma generation region R1 to substantially match the timing when the target 27 is fed to the plasma generation region R1. The delay time Td defines the timing when the target 27 fed to the generation position of the EUV light 277 is irradiated with the pulse laser light 31. Accordingly, in the case of moving the generation position of the EUV light 277 at least in the Y axis direction, the control unit 8 changes the delay time Td. The delay time Td is stored in advance in the control unit The timing when the target 27 fed into the chamber 2 is irradiated with the pulse laser light 31 is also simply referred to as a radiation timing of the pulse laser light 31.

When the laser device 3 receives a trigger signal, the laser device 3 outputs the pulse laser light 31.

The pulse laser light 31 output from the laser device 3 is reflected by the high reflective mirrors 331 and 332 of the laser light transmission optical system 33, passes through the window 215, and is introduced into the chamber 2. The pulse laser light 31 introduced into the chamber 2 is condensed on the plasma generation region R1 by the laser light condensing optical system 22. The pulse laser light 31 condensed on the plasma generation region R1 is radiated to the target 27 fed to the plasma generation region R1.

The target 27 fed to the plasma generation region R1 is made into plasma when it is irradiated with the pulse laser light 31, and emits the radiation light 276. The EUV light 277 included in the radiation light 276 is selectively reflected by the EUV light condensing mirror 231 of the EUV light condensing optical system 23, and is condensed at the intermediate focusing point IF of the connecting section 24. The EUV light 277 condensed at the intermediate focusing point IF is output toward the exposure device 9.

The control unit 8 receives an instruction from the exposure device 9 for moving the generation position of the EUV light 277.

The control unit 8 controls at least one of the stage 26, the manipulator 224, and the radiation timing of the pulse laser light 31 such that the generation position of the EUV light 277 is moved, based on the instruction from the exposure device 9.

Specifically, in the case of moving the generation position of the EUV light 277 within a plane substantially parallel to the XZ plane, the control unit 8 drives the stage 26 to move the position of the target feeder 25. Thereby, the control unit 8 moves the position of the target 27 fed to the plasma generation region R1.

In addition, the control unit 8 drives the manipulator 224 to move the position of the laser light condensing mirror 221. Thereby, the control unit 8 moves the light condensing position of the pulse laser light 31 in the plasma generation region R1.

In addition, the control unit 8 changes the delay time Td to change the radiation timing of the pulse laser light 31 such that the radiation state of the pulse laser light 31 to the target 27 is maintained before and after the movement of the generation position of the EUV light 277. Maintaining the radiation state of the pulse laser light 31 to the target 27 means maintaining a relative positional relation between the position of the target 27 fed to the plasma generation region R1 and the light condensing position of the pulse laser light 31. When such a relative positional relation is deviated, a region where the target 27 irradiated with the pulse laser light 31 is dispersed by laser ablation may be changed, so that the generation position of the EUV light 277 may be deviated from a desired position. Moreover, when such a relative positional relation is deviated, the pulse laser light 31 may not be appropriately radiated to the target 27, so that the performance of the EUV light 277 output from the EUV light generating apparatus 1 may be deteriorated.

An index for evaluating the performance of the EUV light 277 is pulse energy of the EUV light 277 or energy stability, for example. Deterioration of the performance of the EUV light 277 means that pulse energy or energy stability of the EUV light 277 output from the EUV light generating apparatus 1 is deviated from the allowable range thereof, for example. Energy stability of the EUV light 277 is variation in pulse energy of the EUV light 277, and is described as 3σ, for example.

Figure 2:
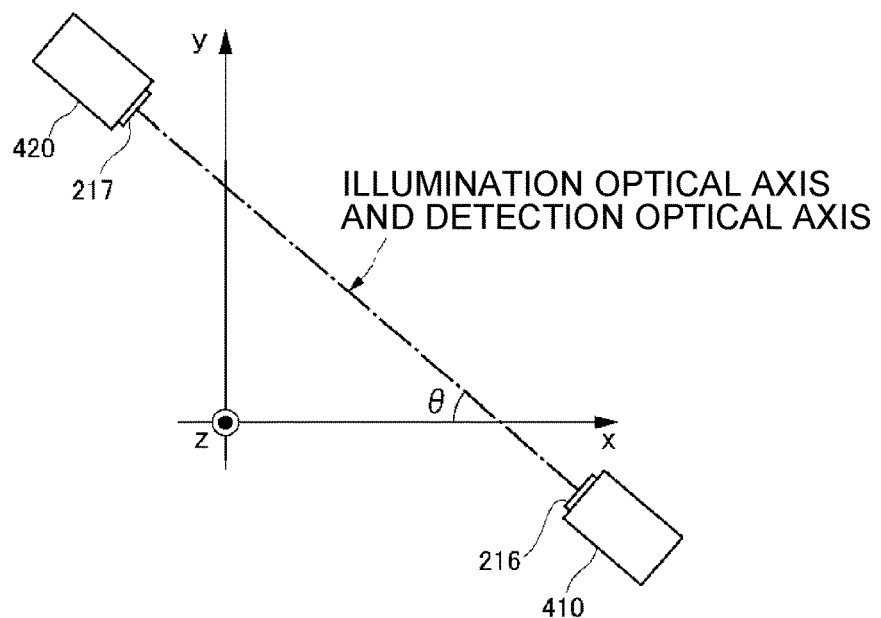
FIG. 2 is a diagram for explaining an arrangement of an illumination unit and a detection unit illustrated in FIG. 1.
Figure 3:
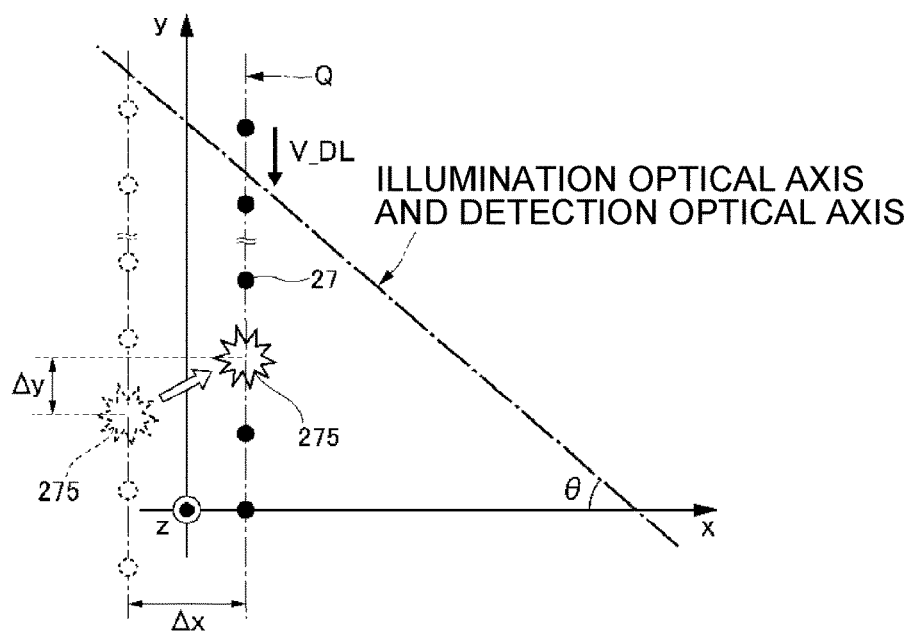
FIG. 3 is a diagram for explaining a delay time that is changed for changing a radiation timing of pulse laser light by an EUV light generating apparatus having a target detection sensor disposed as illustrated in FIG. 2, when a generation position of EUV light is moved.

FIG. 3 is a diagram for explaining the delay time Td changed for changing the radiation timing of the pulse laser light 31 by the EUV light generating apparatus 1 having a target detection sensor 41 disposed as illustrated in FIG. 2, when the generation position of the EUV light 277 is moved.

A broken line in FIG. 3 illustrates the target 27 and the plasma 275 thereof before the generation position of the EUV light 277 is moved. A solid line in FIG. 3 illustrates the target 27 and the plasma 275 thereof after the generation position of the EUV light 277 is moved.

In FIG. 3, moving distances of the generation position of the EUV light 277 in the X axis direction and the Y axis direction are assumed to be Δx and Δy, respectively. When the generation position of the EUV light 277 is moved, the position of the plasma 275 is moved.

In the case of moving the generation position of the EUV light 277 as illustrated in FIG. 3, the control unit 8 changes the delay time Td as represented by Expression 1 to thereby change the radiation timing of the pulse laser light 31.

$$Td'=Td+\Delta t \qquad \text{[Expression 1]}$$

Td' represents the delay time Td after the change. Δt represents the change amount of the delay time Td.

The change amount Δt of the delay time Td is described as represented by Expression 2.

$$\Delta t=(\Delta x\cdot\tan\theta+\Delta y)/V\_DL \qquad \text{[Expression 2]}$$

V_DL represents a travel velocity of the target 27 output into the chamber.

The control unit 8 changes the delay time Td with use of Expressions 1 and 2 to thereby be able to change the radiation timing of the pulse laser light 31 in such a manner as to maintain the relative positional relation between the position of the target 27 fed to the plasma generation region R1 and the light condensing position of the pulse laser light 31. In other words, the control unit 8 changes the delay time Td with use of Expressions 1 and 2 to thereby be able to move the generation position of the EUV light 277 in such a manner as to maintain the relative positional relation between the position of the target 27 fed to the plasma generation region R1 and the light condensing position of the pulse laser light 31.

Further, in the case of moving the generation position of the EUV light 277 only in the Z axis direction, the control unit 8 may drive only the stage 26 to thereby move the position of the target feeder 25. The Rayleigh length of the pulse laser light 31 in the plasma generation region R1 is 100 μm or longer but 1,000 μm or shorter. As such, moving the light condensing position of the pulse laser light 31 in the Z axis direction does not affect much the movement of the generation position of the EUV light 277. Accordingly, in the case of moving the generation position of the EUV light 277 only in the Z axis direction, the control unit 8 may drive only the stage 26.

Further, in the case of moving the generation position of the EUV light 277 in the Y axis direction, the control unit 8 drives the manipulator 224 to thereby move the position of the laser light condensing mirror 221.

In addition, the control unit 8 changes the delay time Td with use of Expressions 1 and 2 to change the radiation timing of the pulse laser light 31.

[2.3 Problem]

The EUV light generating apparatus 1 may perform interlocked operation with the exposure device 9 such as moving the generation position of the EUV light 277 during generation thereof, based on an instruction from the exposure device 9. At that time, the EUV light generating apparatus 1 needs to complete the interlocked operation in a short time while maintaining the performance of the output EUV light 277.

When moving the generation position of the EUV light 277 based on an instruction from the exposure device 9, the control unit 8 according to the comparative example drives the stage 26 and the manipulator 224 as described above. At that time, the control unit 8 according to the comparative example drives the stage 26 and the manipulator 224 in one time of control regardless of the moving distance of the generation position of the EUV light 277, in order to complete moving of the generation position of the EUV light 277 in a short time.

The moving distance of the generation position of the EUV light 277 is a distance from the generation position of the EUV light 277 before moving up to the generation position of the EUV light 277 after moving. In other words, the moving distance of the generation position of the EUV light 277 is a distance from the current generation position of the EUV light 277 up to the generation position of the EUV light 277 corresponding to the instruction from the exposure device 9.

Meanwhile, the driving velocity of the stage 26 and the driving velocity of the manipulator 224 often have a difference.

Accordingly, in the EUV light generating apparatus 1 of the comparative example, the relative positional relation between the position of the target 27 fed to the plasma generation region R1 and the light condensing position of the pulse laser light 31 may be deviated during driving of the stage 26 and the manipulator 224. When the relative positional relation thereof is deviated, the generation position of the EUV light 277 may not become a desired position or the performance of the EUV light 277 may be deteriorated, as described above.

Thereby, the EUV light generating apparatus 1 of the comparative example may issue an error due to detection of performance deterioration of the EUV light 277 and stop operation, during moving of the generation position of the EUV light 277 based on the instruction from the exposure device 9.

When operation of the EUV light generating apparatus 1 is continued while the performance of the EUV light 277 is deteriorated, a large amount of debris that is the target 27 not contributing to generation of the EUV light 277 may be generated in the EUV light generating apparatus 1. When a large amount of debris is generated, the inside of the chamber 2 is likely to be contaminated with the debris in the EUV light generating apparatus 1, whereby the service life of the EUV light generating apparatus 1 may be shortened. In addition, when a large amount of debris is generated, the generation efficiency of the EUV light 277 may be lowered.

Accordingly, it is desired to have a technology enabling the generation position of the EUV light 277 to be moved in a short time during generation thereof, while maintaining the performance of the EUV light 277.

Radiating the pulse laser light 31 to the target 27 fed to the plasma generation region R1 is also referred to as shooting.

Deviation of a relative positional relation between the position of the target 27 fed to the plasma generation region R1 and the light condensing position of the pulse laser light 31 is also referred to as shooting deviation.

3. First Embodiment

An EUV light generating apparatus 1 of a first embodiment will be described with use of FIGS. 4 to 8.

The EUV light generating apparatus 1 of the first embodiment has a configuration in which an EUV light sensor 43 is added to the EUV light generating apparatus 1 of the comparative example. Further, the EUV light generating apparatus 1 of the first embodiment is different from the EUV light generating apparatus 1 of the comparative example in the function of the control unit 8.

The configurations and operations of the EUV light generating apparatus 1 of the first embodiment that are the same as those of the EUV light generating apparatus 1 of the comparative example are not described here.

[3.1 Configuration]

Figure 4:
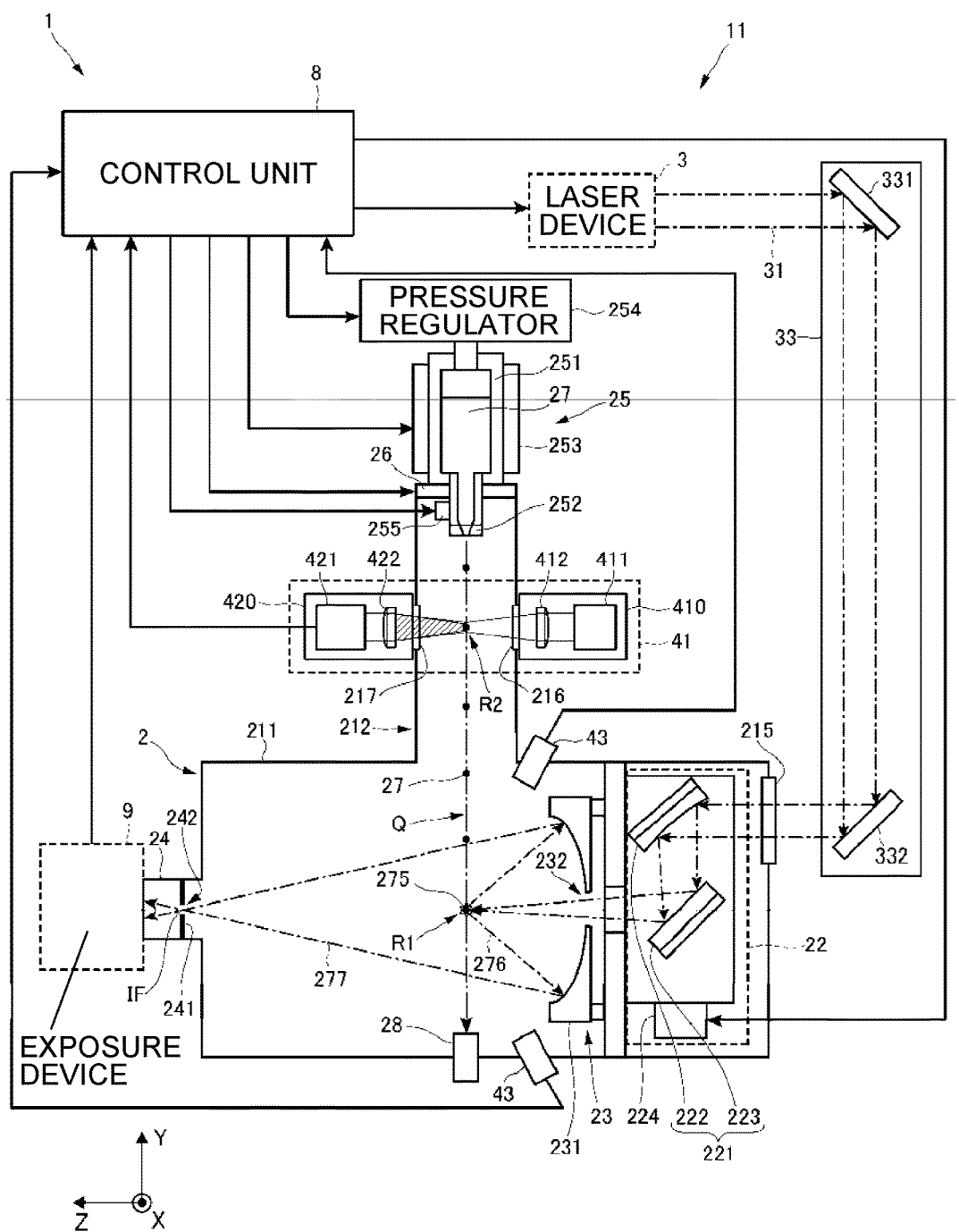
FIG. 4 is a diagram for explaining a configuration of an EUV light generating apparatus of a first embodiment.
Figure 5:
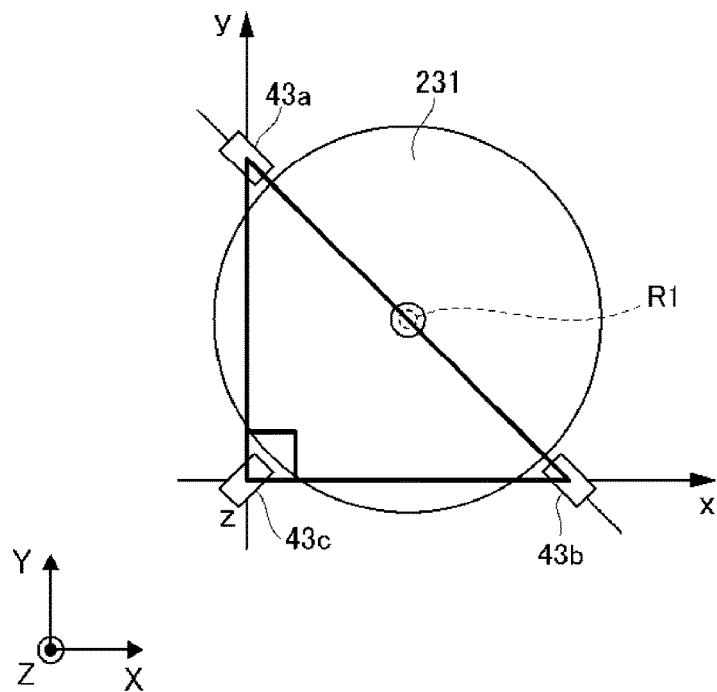
FIG. 5 is a diagram for explaining an arrangement of an EUV light sensor illustrated in FIG. 4.
Figure 6:
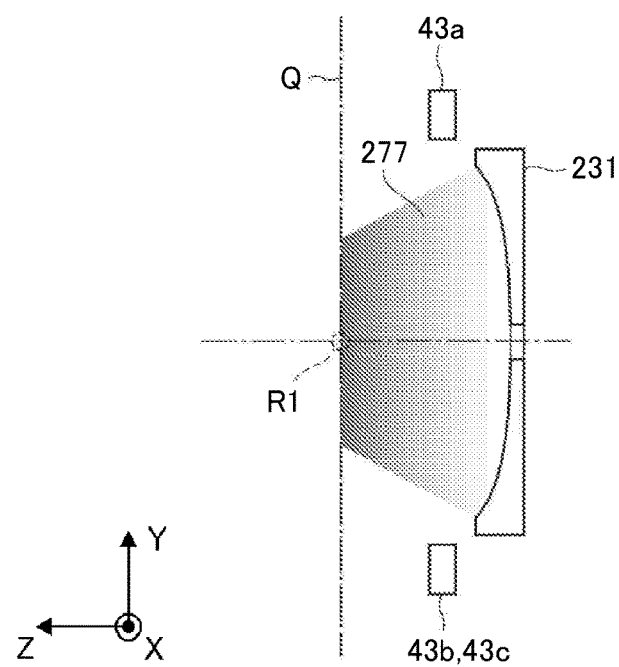
FIG. 6 is a diagram illustrating an arrangement of the EUV light sensor illustrated in FIG. 5, seen from a direction opposite to an X axis direction.

FIG. 4 is a diagram for explaining a configuration of the EUV light generating apparatus 1 of the first embodiment. FIG. 5 is a diagram for explaining an arrangement of the EUV light sensor 43 illustrated in FIG. 4. FIG. 6 is a diagram illustrating the arrangement of the EUV light sensor 43 illustrated in FIG. 5, seen from a direction opposite to the X axis direction.

The EUV light sensor 43 is a sensor for measuring the energy of the EUV light 277 included in the radiation light 276 emitted from the plasma 275.

The EUV light sensor 43 includes a plurality of EUV light sensors 43. The EUV light sensors 43 include EUV light sensors 43a to 43c, for example.

Each of the EUV light sensors 43a to 43c is provided on the wall 211 of the chamber 2 so as to face the plasma generation region R1.

Each of the EUV light sensors 43a to 43c is disposed so as not to block the optical path of the EUV light 277 reflected by the EUV light condensing mirror 231.

Each of the EUV light sensors 43a to 43c is disposed along the outer peripheral edge of the EUV light condensing mirror 231.

Each of the EUV light sensors 43a to 43c is disposed isotropically with respect to the plasma generation region R1 so as to reduce an energy difference measured by the EUV light sensors 43a to 43c when the plasma 275 is generated in the plasma generation region R1.

Each of the EUV light sensors 43a to 43c measures the energy of the EUV light 277 and transmits the measurement value to the control unit 8.

Operation of each of the EUV light sensors 43a to 43c is controlled by the control unit 8.

Each of the EUV light sensors 43a to 43c is disposed at a position where the centroid position of the EUV light 277 is easily evaluated.

For example, the EUV light sensors 43a to 43c are disposed at respective vertexes of an isosceles right triangle as illustrated in FIG. 5, respectively. The isosceles right triangle illustrated in FIG. 5 is arranged such that the center point of the longitudinal side is positioned in the plasma generation region R1, the vertex angle thereof is positioned on the Z axis, and the two short sides are arranged along the X axis and the Y axis respectively.

The EUV light sensor 43a is the EUV light sensor 43 disposed at the vertex positioned on the Y axis of the isosceles right triangle illustrated in FIG. 5.

The EUV light sensor 43b is the EUV light sensor 43 disposed at the vertex positioned on the X axis of the isosceles right triangle illustrated in FIG. 5.

The EUV light sensor 43c is the EUV light sensor 43 disposed at the vertex positioned on the Z axis of the isosceles right triangle illustrated in FIG. 5.

The centroid position of the EUV light 277 is the centroid position of the energy distribution of the EUV light 277. This means that the centroid position of the EUV light 277 is the position of a weighted average of the energy distribution of the EUV light 277. Specifically, the centroid position of the EUV light 277 is a spatial position calculated from a plurality of measurement values obtained by measuring the energy of the EUV light 277 by the EUV light sensors 43a to 43c.

The centroid position of the EUV light 277 is an index reflecting the radiation position of the pulse laser light 31 to the target 27. The centroid position of the EUV light 277 is an index for evaluating whether or not the radiation condition of the pulse laser light 31 to the target 27 is a condition satisfying the performance of the EUV light 277. Performing control to allow the centroid position of the EUV light 277 to be a given position means that the pulse laser light 31 is radiated appropriately to the target 27.

The control unit 8 according to the first embodiment defines the calculated value of Expression 3 as an index for evaluating the centroid position of the EUV light 277 in the X axis direction. The control unit 8 defines the calculated value of Expression 4 as an index for evaluating the centroid position of the EUV light 277 in the Y axis direction.

$$EUV\ \mathrm{Centroid}\_x[\%]=\{(E2-E3)/(E2+E3)\}\times 100 \qquad [\text{Expression 3}]$$

$$EUV\ \mathrm{Centroid}\_y[\%]=\{(E1-E3)/(E1+E3)\}\times 100 \qquad [\text{Expression 4}]$$

E1 represents a measurement value of the EUV light sensor 43a. E2 represents a measurement value of the EUV light sensor 43b. E3 represents a measurement value of the EUV light sensor 43c.

EUV Centroid_x represents the eccentricity of the energy distribution of the EUV light 277 in the X axis direction. EUV Centroid_x is a value obtained by standardizing the deviation relative to a given position with respect to the X axis coordinate component of the centroid position of the current EUV light 277. The given position is the plasma generation region R1. EUV Centroid_y represents the eccentricity of the energy distribution of the EUV light 277 in the Y axis direction. EUV Centroid_y is a value obtained by standardizing the deviation relative to a given position with respect to the Y axis coordinate component of the centroid position of the current EUV light 277.

The control unit 8 is configured to be able to perform EUV light centroid control.

The EUV light centroid control means controlling the manipulator 224 in a feedback method such that the centroid position of the EUV light 277 comes to the given position based on the respective measurement results of the EUV light sensors 43a to 43c during generation of the EUV light 277.

Specifically, the control unit 8 has a function of performing a process described below as the EUV light centroid control.

The control unit 8 transmits a first gate signal to the respective EUV light sensors 43a to 43c at a timing delayed by a predetermined delay time from the timing when a target detection signal is generated.

The first gate signal is a signal for giving a trigger to measure the energy of the EUV light 277 to each of the EUV light sensors 43a to 43c.

When receiving the first gate signals, the EUV light sensors 43a to 43c measure the energy of the EUV light 277 and transmit measurement values E1 to E3 to the control unit 8, respectively.

The control unit 8 evaluates the centroid position of the EUV light 277 with use of Expressions 3 and 4.

The control unit 8 identifies the deviation between the centroid position of the current EUV light 277 and the given position, from the calculated values of Expressions 3 and 4. Then, the control unit 8 identifies the deviation between the light condensing position of the current pulse laser light 31 and a given light condensing position. Then, the control unit 8 determines the driving amount of the manipulator 224 with which the deviation at the light condensing position of the pulse laser light 31 is eliminated. The control unit 8 drives the manipulator 224 according to the determined driving amount to thereby move the light condensing position of the pulse laser light 31.

In the EUV light centroid control, the control unit 8 may move the light condensing position of the pulse laser light 31 by driving the stage on which the high reflective mirror 331 is mounted and the stage on which the high reflective mirror 332 is mounted, instead of the manipulator 224. Moreover, the control unit 8 may drive any of the manipulator 224, the stage on which the high reflective mirror 331 is mounted, and the stage on which the high reflective mirror 332 is mounted, according to the moving amount and the moving speed of the light condensing position of the pulse laser light 31.

When the control unit 8 performs such a process, the relative positional relation between the position of the target 27 fed to the plasma generation region R1 and the light condensing position of the pulse laser light 31 becomes an appropriate positional relation, whereby the centroid position of the EUV light 277 is controlled to be the given position. This means that shooting deviation can be suppressed.

The other components of the EUV light generating apparatus 1 of the first embodiment are the same as those of the EUV light generating apparatus 1 of the comparative example.

[3.2 Operation]

Operation of the EUV light generating apparatus 1 of the first embodiment will be described. Specifically, description will be given on a process performed by the control unit 8 according to the first embodiment when a generation position of the EUV light 277 is moved during generation thereof.

A process performed by the control unit 8 for moving a generation position of the EUV light 277 during generation thereof is also simply referred to as an EUV light moving process.

Figure 7A:
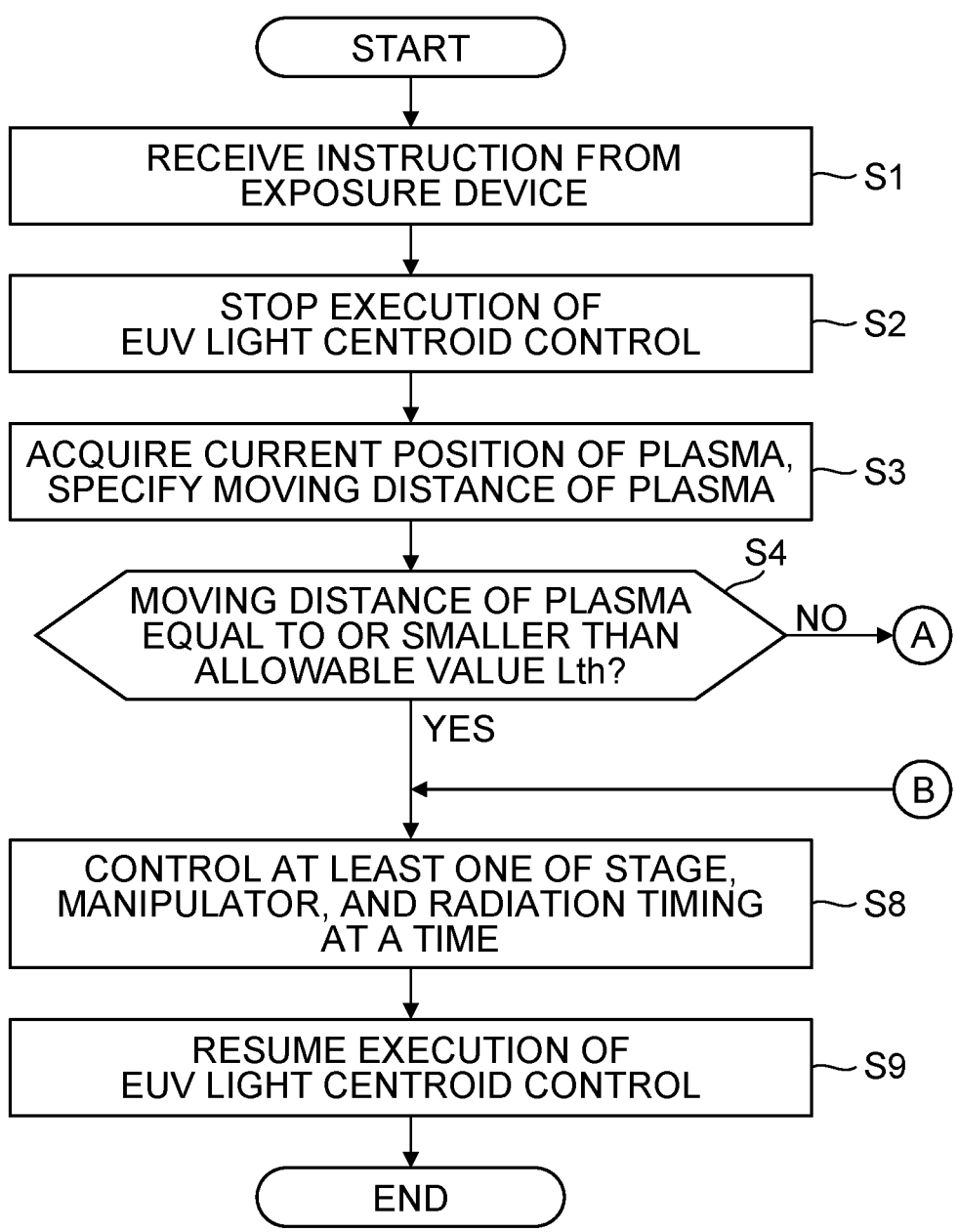
FIGS. 7A and 7B are flowcharts for explaining an outline of an EUV light moving process.
Figure 7B:
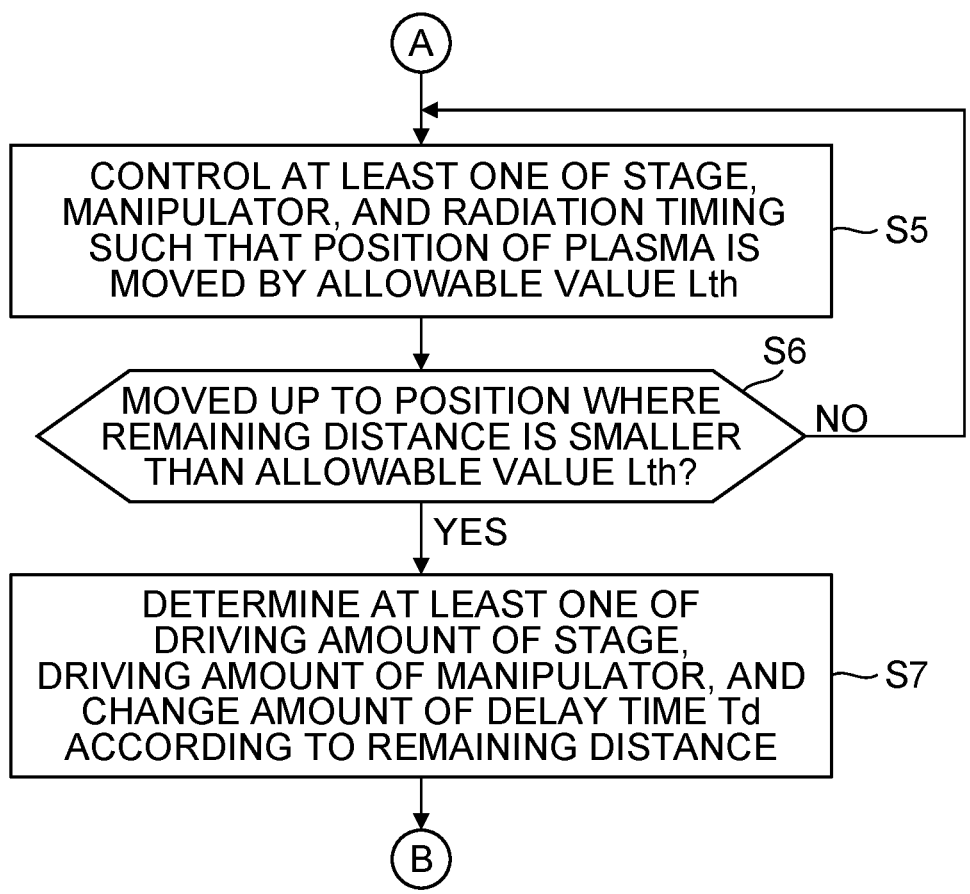

FIGS. 7A and 7B are flowcharts for explaining the outline of the EUV light moving process.

At step S1, the control unit 8 receives an instruction from the exposure device 9 for moving a generation position of the EUV light 277.

At step S2, the control unit 8 stops execution of EUV light centroid control.

At step S3, the control unit 8 acquires the current position of the plasma 275, and specifies a moving distance of the plasma 275.

The current position of the plasma 275 is a position of the plasma 275 held by the control unit 8 at the time of starting the EUV light moving process. The current position of the plasma 275 may be a generation position of the EUV light 277 instructed by the exposure device 9 in the previous EUV light moving process.

As the radiation light 276 including the EUV light 277 is emitted radially from the plasma 275, the generation position of the EUV light 277 has a correlation with the position of the plasma 275. When the generation position of the EUV light 277 is moved, the position of the plasma 275 is moved.

As such, the control unit 8 estimates the position of the plasma 275 generated in the chamber 2 as the generation position of the EUV light 277. Then, the control unit 8 estimates a moving distance of the plasma 275 to be moved according to the instruction from the exposure device 9 as a moving distance of the generation position of the EUV light 277.

The moving distance of the plasma 275 is a distance between a plasma current position that is a current position of the plasma 275 and a plasma target position that is a position of the plasma 275 after being moved according to the instruction from the exposure device 9. The moving distance of the plasma 275 is specified from a differential value between the plasma current position and the plasma target position.

This means that the moving distance of the generation position of the EUV light 277 is specified from a differential value between the plasma current position and the plasma target position.

At step S4, the control unit 8 determines whether or not the moving distance of the plasma 275 is equal to or smaller than an allowable value Lth.

The allowable value Lth is a distance in which a generation position of the EUV light 277 can be moved while performance of the EUV light 277 is maintained, even when there is a difference between the driving velocity of the stage 26 and the driving velocity of the manipulator 224. The allowable value Lth is identified from a spot diameter D of the pulse laser light 31 in the plasma generation region R1. A range of values that can be taken by the allowable value Lth is (D/20) or larger but (D/5) or smaller. A range of values that can be taken by the allowable value Lth is 5 µm or larger but 30 µm or smaller, for example.

When the moving distance of the plasma 275 is equal to or smaller than the allowable value Lth, the control unit 8 proceeds to step S8. Meanwhile, when the moving distance of the plasma 275 is larger than the allowable value Lth, the control unit 8 proceeds to step S5.

At step S5, the control unit 8 controls at least one of the stage 26, the manipulator 224, and the radiation timing such that the position of the plasma 275 is moved by the allowable value Lth.

Specifically, the control unit 8 determines at least one of the driving amount of the stage 26, the driving amount of the manipulator 224, and the change amount of the delay time Td, with use of the allowable value Lth. Then, the control unit 8 controls at least one of the stage 26, the manipulator 224, and the radiation timing according to at least one of the driving amount of the stage 26, the driving amount of the manipulator 224, and the change amount of the delay time Td determined.

At step S6, the control unit 8 determines whether or not the plasma 275 is moved up to a position where the remaining distance is smaller than the allowable value Lth.

The remaining distance is a distance showing how much farther the plasma 275 is required to be moved for allowing the position of the plasma 275 to reach the plasma target position.

The control unit 8 proceeds to step S5 if the plasma 275 is not moved up to a position where the remaining distance is smaller than the allowable value Lth. Meanwhile, if the plasma 275 is moved up to a position where the remaining distance is smaller than the allowable value Lth, the control unit 8 proceeds to step S7.

At step S7, the control unit 8 determines at least one of the driving amount of the stage 26, the driving amount of the manipulator 224, and the change amount of the delay time Td, according to the remaining distance.

At step S8, the control unit 8 controls at least one of the stage 26, the manipulator 224, and the radiation timing, at a time.

Specifically, the control unit 8 controls at least one of the stage 26, the manipulator 224, and the radiation timing as described below, when the step proceeds from step S4 to step S8.

This means that the control unit 8 determines at least one of the driving amount of the stage 26, the driving amount of the manipulator 224, and the change amount of the delay time Td, according to the moving distance of the plasma 275 specified at step S3. Then, the control unit 8 controls at least one of the stage 26, the manipulator 224, and the radiation timing at a time, according to at least one of the determined driving amount of the stage 26, the determined driving amount of the manipulator 224, and the determined change amount of the delay time Td.

Further, when the step proceeds from step S7 to step S8, the control unit 8 controls at least one of the stage 26, the manipulator 224, and the radiation timing as described below.

That is, the control unit 8 controls at least one of the stage 26, the manipulator 224, and the radiation timing at a time, according to at least one of the driving amount of the stage 26, the driving amount of the manipulator 224, and the change amount of the delay time Td determined at step S7.

At step S9, the control unit 8 resumes execution of the EUV light centroid control. Then, the control unit 8 ends the process.

As described above, the control unit 8 controls the EUV light moving process in a feedforward method.

Figure 8A:
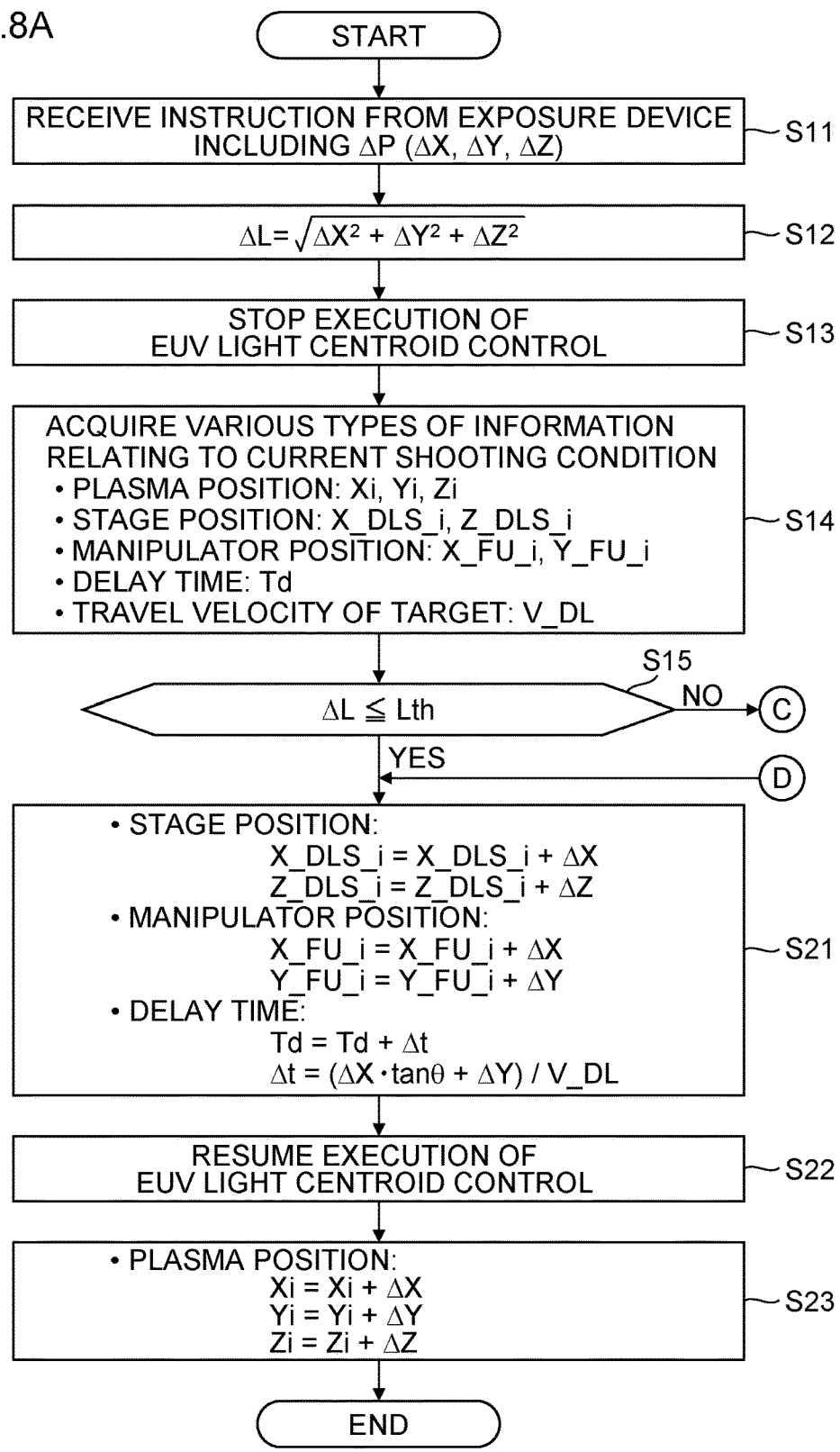
FIGS. 8A and 8B are flowcharts of an EUV light moving process performed by a control unit according to the first embodiment.
Figure 8B:
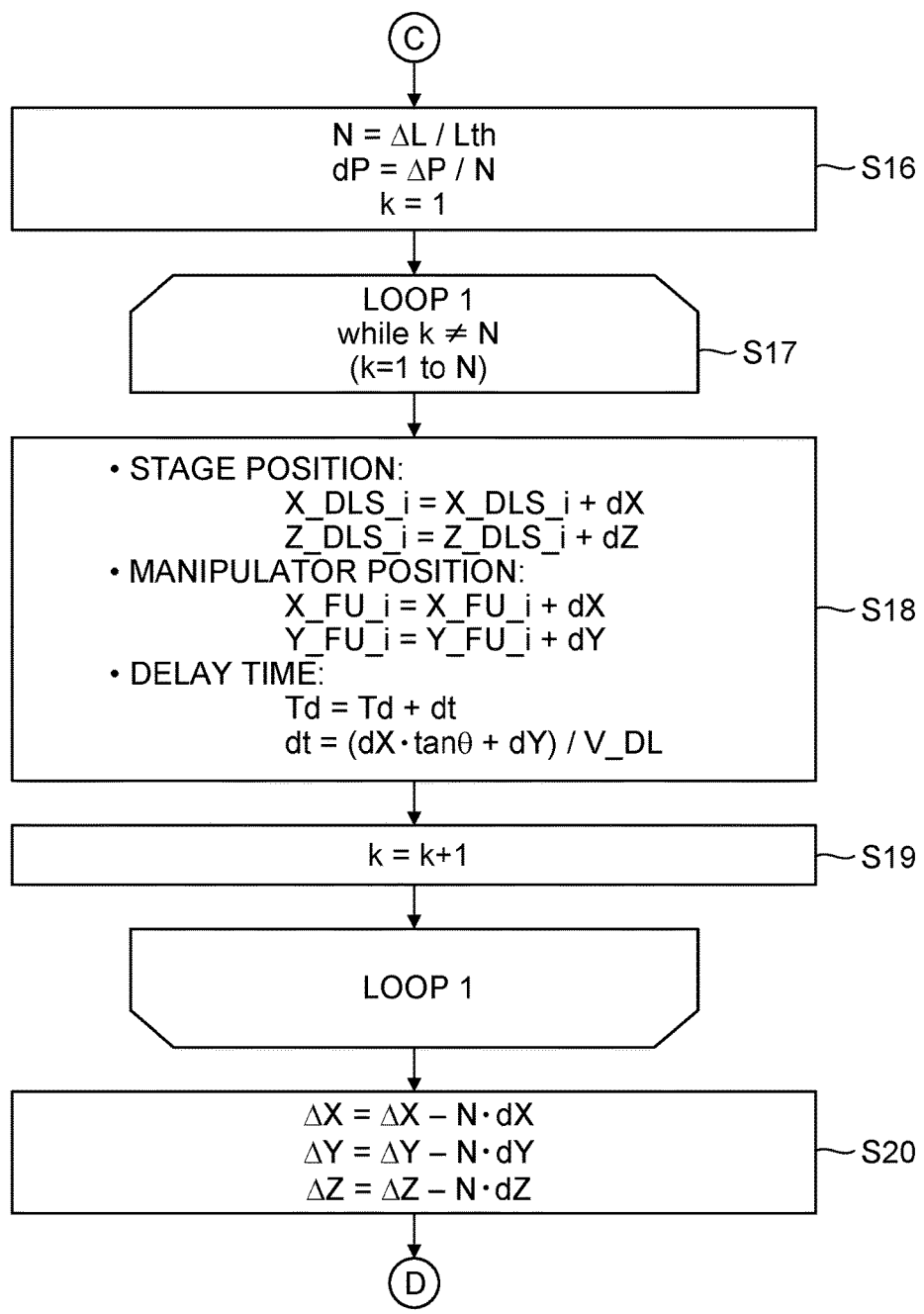

FIGS. 8A and 8B are flowcharts of the EUV light moving process performed by the control unit 8 according to the first embodiment.

FIGS. 8A and 8B and FIGS. 14A, 14B, 19A and 19B described below are flowcharts illustrating the EUV light moving process illustrated in FIGS. 7A and 7B in detail for respective embodiments.

At step S11, the control unit 8 receives an instruction from the exposure device 9 for moving the generation position of the EUV light 277.

The instruction from the exposure device 9 includes a differential value ΔP (ΔX, ΔY, ΔZ) between the plasma current position and the plasma target position. This means that the differential value ΔP is a deviation between the plasma current position and the plasma target position. The instruction from the exposure device 9 is an instruction to instruct the control unit 8 to move the position of the plasma 275 according to the differential value ΔP.

At step S12, the control unit 8 calculates a moving distance ΔL of the plasma 275 as represented by Expression 5. This means that the control unit 8 specifies the moving distance ΔL of the plasma 275 from the differential value ΔP.

$$\Delta L = \sqrt{\Delta X^2 + \Delta Y^2 \times \Delta Z^2} \quad \text{[Expression 5]}$$

At step S13, the control unit 8 stops execution of EUV light centroid control.

When stopping execution of the EUV light centroid control, the control unit 8 stores an objective centroid position (EUV-Cent_Xi, EUV-Cent_Yi) that is a control objective value of the centroid position of the EUV light 277.

At step S14, the control unit 8 acquires various types of information relating to the current shooting condition.

Specifically, the control unit 8 acquires a current position (Xi, Yi, Zi) of the plasma 275, a current position (X_DLS_i, Z_DLS_i) of the stage 26, a current position (X_FU_i, Y_FU_i) of the manipulator 224, and a current delay time Td. In addition, the control unit 8 acquires a travel velocity V_DL of the target.

At step S15, the control unit 8 determines whether or not the moving distance ΔL of the plasma 275 is equal to or smaller than the allowable value Lth with use of Expression 6.

$$\Delta L \leq Lth \quad \text{[Expression 6]}$$

When the moving distance ΔL of the plasma 275 is equal to or smaller than the allowable value Lth, the control unit 8 proceeds to step S21. Meanwhile, when the moving distance ΔL of the plasma 275 is larger than the allowable value Lth, the control unit 8 proceeds to step S16.

At step S16, the control unit 8 sets parameters N, dP, and k for moving the position of the plasma 275 by the allowable value Lth, as represented by Expressions 7 to 9.

$$N = \Delta L / Lth \quad \text{[Expression 7]}$$

$$dP = \Delta P / N \quad \text{[Expression 8]}$$

$$k = 1 \quad \text{[Expression 9]}$$

The control unit 8 sets the quotient obtained by calculating the right side of Expression 7 to N. N is a natural number and is a value obtained by rounding down the remainder obtained from the calculation of the right side of Expression 7. N is the number of times that the position of the plasma 275 is moved by the allowable value Lth. This means that N is the number of times that the control unit 8 performs control to move the position of the plasma 275 by the allowable value Lth when moving the position of the plasma 275 by the moving distance ΔL. The remainder obtained from the calculation of the right side of Expression 7 corresponds to the remaining distance.

The control unit 8 also sets a calculated value of the right side of Expression 8 to dP (dX, dY, dZ). dP (dX, dY, dZ) is a deviation between a position of the plasma 275 that is a moving destination in one control cycle by the control unit 8 and a position of the plasma 275 before being moved. Setting dP (dX, dY, dZ) as in Expression 8 means that the position of the plasma 275 is moved by the allowable value Lth in one control cycle by the control unit 8.

The control unit 8 also sets 1 to k as an initial value, as represented by Expression 9. k is an argument relating to N. k is a natural number equal to or larger than 1 but equal to or smaller than N.

At step S17, the control unit 8 performs a loop 1 in which processes of steps S18 and S19 are repeated until the argument k takes N, as represented by Expression 10.

$$\text{while } k \neq N \quad \text{[Expression 10]}$$

(k=1 to N)

At step S18, the control unit 8 determines at least one of the driving amount of the stage 26, the driving amount of the manipulator 224, and the change amount of the delay time Td, with use of dp (dX, dY, dZ) of Expression 8, as represented by Expressions 11 to 13.

$$X\_DLS\_i = X\_DLS\_i + dX$$

$$Z\_DLS\_i = Z\_DLS\_i + dZ \quad \text{[Expression 11]}$$

$$X\_FU\_i = x\_FU\_i + dX$$

$$Y\_FU\_i = Y\_FU\_i + dY \quad \text{[Expression 12]}$$

$$Td = Td + dt$$

$$dt = (dX \cdot \tan\theta + dY)/V\_DL \quad \text{[Expression 13]}$$

Specifically, as represented by Expression 11, the control unit 8 determines the driving amount of the stage 26 in the X axis direction to be dX, and determines the driving amount of the stage 26 in the Z axis direction to be dZ. As represented by Expression 12, the control unit 8 determines the driving amount of the manipulator 224 in the X axis direction to be dX, and determines the driving amount of the manipulator 224 in the Y axis direction to be dY. As represented by Expression 13, the control unit 8 determines the change amount dt of the delay time Td with use of dX and dY.

Then, the control unit 8 controls at least one of the stage 26, the manipulator 224, and the radiation timing at a time, according to at least one of the determined driving amount of the stage 26, the determined driving amount of the manipulator 224, and the determined change amount of the delay time Td.

Specifically, the control unit 8 drives the stage 26 such that the position (X_DLS_i, Z_DLS_i) of the stage 26 is moved to the position represented by Expression 11. The control unit 8 drives the manipulator 224 such that the position (X_FU_i, Y_FU_i) of the manipulator 224 is moved to the position represented by Expression 12. The control unit 8 changes the delay time Td such that the radiation timing of the pulse laser light 31 is defined by the delay time Td represented by Expression 13.

At step S19, the control unit 8 increments the argument k as represented by Expression 14.

$$k = k + 1 \quad \text{[Expression 14]}$$

When the loop 1 in which processes of steps S18 and S19 are repeated is performed, the position of the plasma 275 can be moved N times by the allowable value Lth. At that time, the position of the plasma 275 can be moved linearly toward the plasma target position.

However, the position of the plasma 275 moved N times by the allowable value Lth may not reach the plasma target position. In that case, the control unit 8 needs to further move the position of the plasma 275 by the remaining distance corresponding to the remainder obtained by calculating the right side of Expression 7.

At step S20, the control unit 8 updates ΔP (ΔX, ΔY, ΔZ) as represented by Expression 15.

Specifically, as represented by Expression 15, the control unit 8 updates the differential value ΔP (ΔX, ΔY, ΔZ) such that the differential value ΔP (ΔX, ΔY, ΔZ) becomes a deviation between the position of the plasma 275 after execution of the loop 1 and the plasma target position. Thereby, at step S21, the control unit 8 can further move the position of the plasma 275 by the remaining distance corresponding to the remainder obtained by calculating the right side of Expression 7.

$$\Delta X = \Delta X - N \cdot dX$$

$$\Delta Y = \Delta Y - N \cdot dY$$

$$\Delta Z = \Delta Z - N \cdot dZ \quad \text{[Expression 15]}$$

At step S21, the control unit 8 determines at least one of the driving amount of the stage 26, the driving amount of the manipulator 224, and the change amount of the delay time Td, with use of the differential value ΔP (ΔX, ΔY, ΔZ), as represented by Expressions 16 to 18.

$$X\_DLS\_i = X\_DLS\_i + \Delta X$$

$$Z\_DLS\_i = Z\_DLS\_i + \Delta Z \quad \text{[Expression 16]}$$

$$X\_FU\_i = X\_FU\_i + \Delta X$$

$$Y\_FU\_i = Y\_FU\_i + \Delta Y \quad \text{[Expression 17]}$$

$$Td = Td + \Delta t$$

$$\Delta t = (\Delta X \cdot \tan\theta + \Delta Y)/V\_DL \quad \text{[Expression 18]}$$

Specifically, as represented by Expression 16, the control unit 8 determines the driving amount of the stage 26 in the X axis direction to be ΔX, and determines the driving amount of the stage 26 in the Z axis direction to be ΔZ. As represented by Expression 17, the control unit 8 determines the driving amount of the manipulator 224 in the X axis direction to be ΔX, and determines the driving amount of the manipulator 224 in the Y axis direction to be ΔY. As represented by Expression 18, the control unit 8 determines the amount of change Δt of the delay time Td with use of ΔX and ΔY.

Then, the control unit 8 controls at least one of the stage 26, the manipulator 224, and the radiation timing at a time, according to at least one of the driving amount of the stage 26, the driving amount of the manipulator 224, and the change amount of the delay time Td determined.

Specifically, the control unit 8 drives the stage 26 such that the position (X_DLS_i, Z_DLS_i) of the stage 26 is moved to the position represented by Expression 16. The control unit 8 drives the manipulator 224 such that the position (X_FU_i, Y_FU_i) of the manipulator 224 is moved to the position represented by Expression 17. The control unit 8 changes the delay time Td such that the radiation timing of the pulse laser light 31 is defined by the delay time Td represented by Expression 18.

At step S22, the control unit 8 resumes execution of the EUV light centroid control.

When resuming execution of the EUV light centroid control, the control unit 8 sets the objective centroid position (EUV-Cent_Xi, EUV-Cent_Yi) stored at step S13 to the objective centroid position of the EUV light 277.

When execution of the EUV light centroid control is resumed, the relative positional relation between the position of the target 27 fed to the plasma generation region R1 and the light condensing position of the pulse laser light 31 is slightly regulated after the EUV light moving process.

At step S23, the control unit 8 updates the position (Xi, Yi, Zi) of the plasma 275 as represented by Expression 19. Then, the control unit 8 ends the process.

$$Xi = Xi + \Delta X$$

$$Yi = Yi + \Delta Y$$

$$Zi = Zi + \Delta Z \quad \text{[Expression 19]}$$

The other operations of the EUV light generating apparatus 1 of the first embodiment are the same as those of the EUV light generating apparatus 1 of the comparative example.

[3.3 Effect]

The control unit 8 according to the first embodiment can determine the driving amount of the stage 26, the driving amount of the manipulator 224, and the change amount of the delay time Td with use of the differential value ΔP, when the moving distance of the EUV light 277 is the allowable value Lth or smaller. Then, according to the respective driving amounts and the change amount determined with use of the differential value ΔP, the control unit 8 can control the stage 26, the manipulator 224, and the radiation timing at a time.

Accordingly, the control unit 8 can move the generation position of the EUV light 277 during generation thereof to the position corresponding to the instruction from the exposure device 9, in one control cycle. At that time, the control unit 8 can move the generation position of the EUV light 277 linearly while maintaining the performance of the EUV light 277.

Meanwhile, when the moving distance of the EUV light 277 is larger than the allowable value Lth, the control unit 8 according to the first embodiment can determine the driving amount of the stage 26, the driving amount of the manipulator 224, and the change amount of the delay time Td with use of the allowable value Lth. Then, according to the respective driving amounts and the change amount determined with use of the allowable value Lth, the control unit 8 can control the stage 26, the manipulator 224, and the radiation timing at a time. Then, the control unit 8 can repeat control of the stage 26, the manipulator 224, and the radiation timing a plurality of times.

Accordingly, the control unit 8 can move the generation position of the EUV light 277 during generation thereof to the position corresponding to the instruction from the exposure device 9, while moving the position of the plasma 275 a plurality of times by the allowable value Lth. At that time, the control unit 8 can move the generation position of the EUV light 277 linearly as much as possible, while maintaining the performance of the EUV light 277.

Thereby, when moving the generation position of the EUV light 277 based on the instruction from the exposure device 9, the EUV light generating apparatus 1 of the first embodiment can move the generation position of the EUV light 277 in a short time during generation thereof while maintaining the performance of the EUV light 277.

As a result, the EUV light generating apparatus 1 of the first embodiment can move the generation position of the EUV light 277 having desired performance in a short time during generation thereof, while suppressing operation stop due to an error alarm, shortened service life due to debris contamination, and a drop of generation efficiency of the EUV light 277.

4. Second Embodiment

An EUV light generating apparatus 1 of a second embodiment will be described with use of FIGS. 9 to 14.

The EUV light generating apparatus 1 of the second embodiment has a configuration in which first and second image sensors 45 and 47 are added to the EUV light generating apparatus 1 of the first embodiment. Further, the EUV light generating apparatus 1 of the second embodiment is different from the EUV light generating apparatus 1 of the first embodiment in the operation of the control unit 8.

Regarding the configurations and operations of the EUV light generating apparatus 1 of the second embodiment, the same configurations and operations as those of the EUV light generating apparatus 1 of the first embodiment are not described repeatedly.

[4.1 Configuration]

Figure 9:
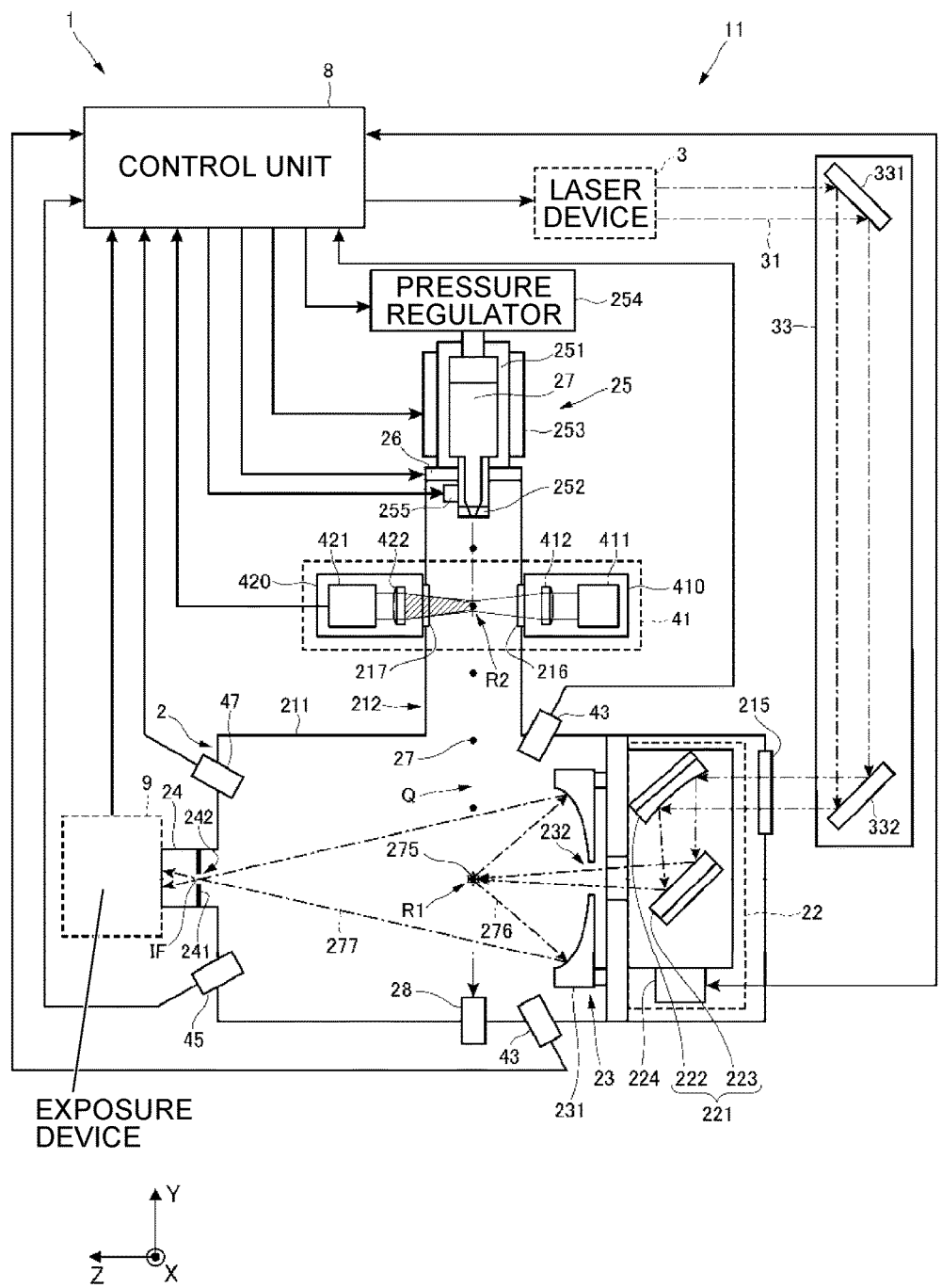
FIG. 9 is a diagram for explaining a configuration of an EUV light generating apparatus of a second embodiment.
Figure 10:
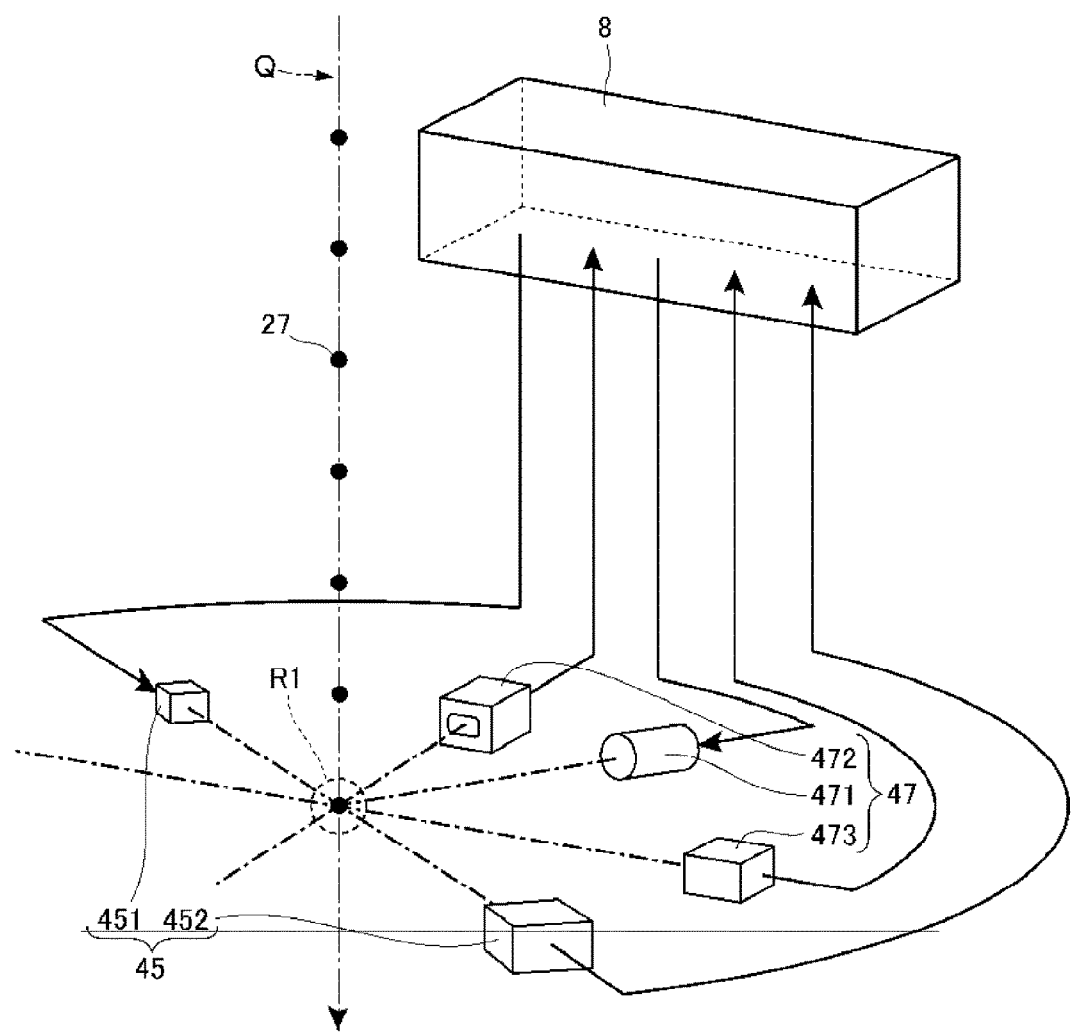
FIG. 10 is a diagram for explaining configurations of a first image sensor and a second image sensor illustrated in FIG. 9.

FIG. 9 is a diagram for explaining a configuration of the EUV light generating apparatus 1 of the second embodiment. FIG. 10 is a diagram for explaining configurations of the first and second image sensors 45 and 47 illustrated in FIG. 9.

Each of the first and second image sensors 45 and 47 is a sensor that captures an image of an imaging region that is a region including a position of the target 27 fed to the plasma generation region R1.

The first image sensor 45 is a sensor that captures an image of a region including the plasma generation region R1. The first image sensor 45 is a sensor that captures an image of the target 27 fed to the plasma generation region R1.

The first image sensor 45 is provided on the wall 211 of the chamber 2 so as to face the plasma generation region R1.

As illustrated in FIG. 10, the first image sensor 45 includes an illumination unit 451 and an imaging unit 452.

The illumination unit 451 and the imaging unit 452 are disposed such that at least a Y axis coordinate component at the position of the target 27 fed to the plasma generation region R1 can be measured from an image captured by the imaging unit 452.

Specifically, the illumination unit 451 and the imaging unit 452 are disposed to face each other over the plasma generation region R1. This means that the illumination unit 451 and the imaging unit 452 are disposed such that the illumination optical axis of the illumination unit 451 and the detection optical axis of the imaging unit 452 pass through the plasma generation region R1 almost coaxially. In addition, the illumination unit 451 and the imaging unit 452 are disposed such that the illumination optical axis of the illumination unit 451 and the detection optical axis of the imaging unit 452 are included in a plane almost parallel to the XZ plane. In addition, the illumination unit 451 and the imaging unit 452 are disposed such that the illumination optical axis of the illumination unit 451 and the detection optical axis of the imaging unit 452 cross a plane almost parallel to the XY plane.

The illumination optical axis of the illumination unit 451 is an optical path axis of illumination light output from the illumination unit 451 toward the plasma generation region R1.

The detection optical axis of the imaging unit 452 is an optical path axis of illumination light detected by the imaging unit 452, of the illumination light output from the illumination unit 451 toward the plasma generation region R1.

The illumination unit 451 outputs illumination light toward the plasma generation region R1 so as to illuminate the target 27 fed to the plasma generation region R1.

The illumination unit 451 is configured with use of a light source that outputs pulse light having high luminance and a short time width such as a laser light source or a flash lamp.

Operation of the illumination unit 451 is controlled by the control unit 8.

The imaging unit 452 captures an image of illumination light output to illuminate the target 27 fed to the plasma generation region R1 to thereby capture an image of the target 27 fed to the plasma generation region R1.

The imaging unit 452 includes a detection element such as a charge-coupled device (CCD) and a shutter such as an image intensifier unit (IIU).

The imaging unit 452 exposes, to the detection element of the imaging unit 452, the illumination light passing through the surroundings of the target 27 fed to the plasma generation region R1 to detect it to thereby capture an image of a shade of the target 27 fed to the plasma generation region R1. The imaging unit 452 transmits a signal including the captured image to the control unit 8.

Operation of the imaging unit 452 is controlled by the control unit 8.

The second image sensor 47 is a sensor that captures an image of a region including the plasma generation region R1. The second image sensor 47 is a sensor that captures an image of the target trajectory Q near the plasma generation region R1. The second image sensor 47 is a sensor that captures an image of the target 27 traveling on the target trajectory Q near the plasma generation region R1.

The second image sensor 47 is provided on the wall 211 of the chamber 2 so as to face the plasma generation region R1.

As illustrated in FIG. 10, the second image sensor 47 includes an illumination unit 471, an imaging unit 472, and an imaging unit 473.

The illumination unit 471 and the imaging units 472 and 473 are disposed such that a Z axis coordinate component and an X axis coordinate component at the position of the target 27 fed to the plasma generation region R1 can be measured from an image captured by the imaging units 472 and 473.

Specifically, the illumination unit 471 and the imaging units 472 and 473 are disposed such that the illumination optical axis of the illumination unit 471 and the respective detection optical axes of the imaging units 472 and 473 pass through the plasma generation region R1 from the same directions that are not parallel to each other. In addition, the illumination unit 471 and the imaging units 472 and 473 are disposed such that the illumination optical axis of the illumination unit 471 and the respective detection optical axes of the imaging units 472 and 473 are included in a plane almost parallel to the XZ plane. In addition, the imaging units 472 and 473 are disposed such that the respective detection optical axes of the imaging units 472 and 473 cross a plane almost parallel to the YZ plane and a plane almost parallel to the XY plane, respectively. It is preferable that the imaging units 472 and 473 are disposed such that the respective detection optical axes of the imaging units 472 and 473 are almost orthogonal to a plane almost parallel to the YZ plane and a plane almost parallel to the XY plane, respectively.

The illumination optical axis of the illumination unit 471 is an optical path axis of illumination light output from the illumination unit 471 toward the plasma generation region R1.

The detection optical axis of the imaging unit 472 is an optical path axis of illumination light detected by the imaging unit 472, of the illumination light output from the illumination unit 471 toward the plasma generation region R1 and reflected by the target 27 traveling on the target trajectory Q near the plasma generation region R1.

The detection optical axis of the imaging unit 473 is an optical path axis of illumination light detected by the imaging unit 473, of the illumination light output from the illumination unit 471 toward the plasma generation region R1 and reflected by the target 27 traveling on the target trajectory Q near the plasma generation region R1.

The illumination light output from the illumination unit 471 toward the plasma generation region R1 and reflected by the target 27 traveling on the target trajectory Q near the plasma generation region R1 is also simply referred to as reflected light from the target 27.

The illumination unit 471 outputs illumination light toward the vicinity of the plasma generation region R1 so as to illuminate the target 27 traveling on the target trajectory Q near the plasma generation region R1.

The illumination unit 471 includes a light source that outputs continuous light such as a CW laser.

Operation of the illumination unit 471 is controlled by the control unit 8.

The illumination unit 471 may include a plurality of illumination units 471 corresponding to the imaging units 472 and 473 respectively.

The imaging units 472 and 473 capture images of the reflected light from the target 27 from different directions to thereby capture images of the target trajectory Q near the plasma generation region R1.

Each of the imaging units 472 and 473 includes a detection element such as a CCD and a shutter such as an IIU.

Each of the imaging units 472 and 473 detects the reflected light from the target 27 by exposing it to each detection element to thereby capture an image of the target trajectory Q near the plasma generation region R1. Each of the imaging units 472 and 473 transmits a signal including the captured image to the control unit 8.

Operation of each of the imaging units 472 and 473 is controlled by the control unit 8.

The other components of the EUV light generating apparatus 1 of the second embodiment are the same as those of the EUV light generating apparatus 1 of the first embodiment.

[4.2 Operation]

Operation of the EUV light generating apparatus 1 of the second embodiment will be described.

First, the first and second image sensor 45 and 47 according to the second embodiment and a process performed by the control unit 8 that controls the operation thereof will be described with use of FIGS. 11 to 13.

Figure 11:
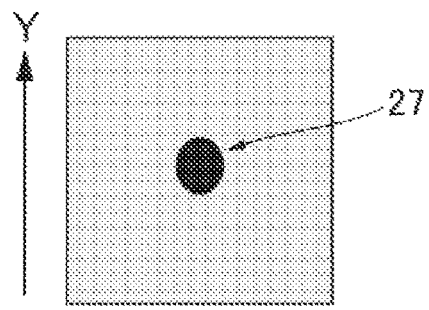
FIG. 11 is a diagram for explaining an image captured by an imaging unit included in the first image sensor illustrated in FIG. 10.

FIG. 11 is a diagram for explaining an image captured by the imaging unit 452 included in the first image sensor 45 illustrated in FIG. 10. FIG. 12 is a diagram for explaining an image captured by the imaging unit 472 included in the second image sensor 47 illustrated in FIG. 10. FIG. 13 is a diagram for explaining an image captured by the imaging unit 473 included in the second image sensor 47 illustrated in FIG. 10.

The control unit 8 according to the second embodiment transmits a second gate signal to the first image sensor 45 so as to allow an image of the target 27 fed to the plasma generation region R1 to be captured appropriately. The control unit 8 transmits a control signal for outputting illumination light from the illumination unit 451 to the first image sensor 45 in synchronization with the transmission timing of the second gate signal.

The second gate signal is a signal that gives, to the first image sensor 45, a trigger to capture an image of the target 27 fed to the plasma generation region R1. The second gate signal is a signal for exposing the detection element of the imaging unit 452 by allowing the shutter of the imaging unit 452 to open for the time width thereof to thereby enable an image to be captured.

Specifically, the control unit 8 transmits the second gate signal at the timing delayed by a predetermined delay time from the timing of generating a target detection signal such that the shutter opens at the timing when the target 27 corresponding to the target detection signal reaches the plasma generation region R1. The control unit 8 outputs the second gate signal having a predetermined time width such that the shutter is closed before the plasma 275 is generated from the target 27 corresponding to the target detection signal.

The control unit 8 transmits a third gate signal to the second image sensor 47 so as to allow an image of the target trajectory Q near the plasma generation region R1 to be captured appropriately. The control unit 8 continues transmission of control signals for outputting illumination light from the illumination unit 471 to the second image sensor 47 beforehand.

The third gate signal is a signal that gives, to the second image sensor 47, a trigger to capture an image of the target trajectory Q near the plasma generation region R1. The third gate signal is a signal for exposing the detection element of each of the imaging units 472 and 473 by allowing the shutter of each of the imaging units 472 and 473 to open for the time width thereof to thereby enable an image to be captured.

Specifically, the control unit 8 transmits the third gate signal at the timing delayed by a predetermined delay time from the timing of generating a target detection signal such that the shutter opens at the timing when the target 27 corresponding to the target detection signal reaches the plasma generation region R1. The control unit 8 outputs the third gate signal having a predetermined time width such that the shutter is closed before the plasma 275 is generated from the target 27 corresponding to the target detection signal.

When the first image sensor 45 receives the second gate signal, the first image sensor 45 captures an image of the target 27 fed to the plasma generation region R1. For example, as illustrated in FIG. 11, the first image sensor 45 captures an image in which a Y axis coordinate component at the position of the target 27 fed to the plasma generation region R1 can be measured.

The illumination light output from the illumination unit 451 of the first image sensor 45 is pulse light having high luminance and a short time width. Accordingly, the time width of the second gate signal may be short corresponding to the time width of the illumination light. When the time width of the second gate signal is short, the exposure time of the detection element of the imaging unit 452 is shortened.

Accordingly, as illustrated in FIG. 11, the first image sensor 45 can capture a still image of the target 27 fed to the plasma generation region R1. With the still image as illustrated in FIG. 11, the control unit 8 can measure a Y axis coordinate component at the position of the target 27 fed to the plasma generation region R1 at a certain time.

The first image sensor 45 transmits a signal including the captured image to the control unit 8.

When the second image sensor 47 receives the third gate signal, the second image sensor 47 captures an image of the target trajectory Q near the plasma generation region R1. For example, as illustrated in FIGS. 12 and 13, the imaging units 472 and 473 of the second image sensor 47 capture images in which a Z axis coordinate component and an X axis coordinate component at the position of the target 27 fed to the plasma generation region R1 can be measured, respectively.

The illumination light output from the illumination unit 471 of the second image sensor 47 is continuous light. Accordingly, the time width of the third gate signal may be relatively longer than that of the second gate signal. Further, the time width of the third gate signal may be shorter than the generation cycle of target detection signals. Furthermore, the third gate signal may be transmitted a plurality of times in synchronization with the generation timing of target detection signals. When the time width of the third gate signal is relatively longer than that of the second gate signal and is shorter than the generation cycle of the target detection signals, the time in which the respective detection elements of the imaging units 472 and 473 are exposed is longer than the time in which the detection element of the imaging unit 452 is exposed and is shorter than the generation cycle of the target detection signals. Moreover, when the third gate signal is transmitted a plurality of times in synchronization with the generation timing of the target detection signals, the exposure cycle of the respective detection elements of the imaging units 472 and 473 is almost identical to the generation cycle of the target detection signals.

Figure 12:
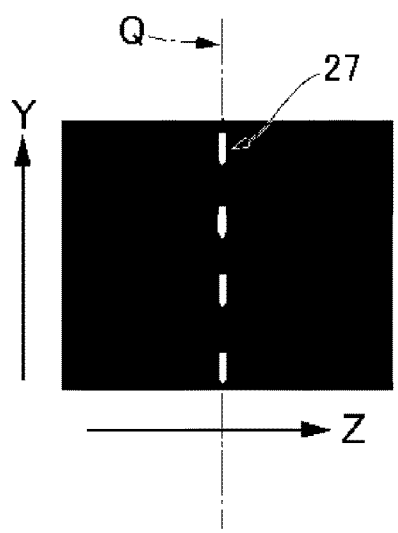
FIG. 12 is a diagram for explaining an image captured by an imaging unit included in the second image sensor illustrated in FIG. 10.
Figure 13:
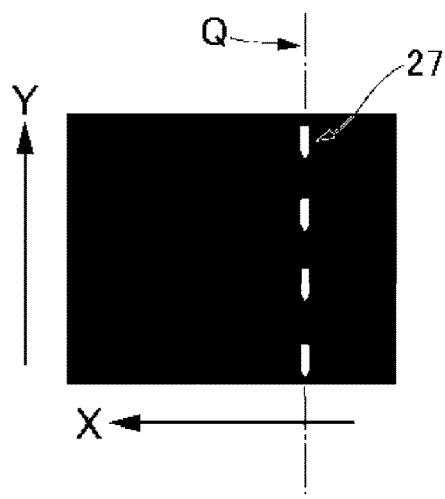
FIG. 13 is a diagram for explaining an image captured by the imaging unit included in the second image sensor illustrated in FIG. 10.

Accordingly, as illustrated in FIGS. 12 and 13, the second image sensor 47 captures an image in which a plurality of tracks of the targets 27 traveling on the target trajectory Q near the plasma generation region R1 are continued in broken line patterns. With the two images as illustrated in FIGS. 12 and 13, the control unit 8 can measure a Z axis coordinate component and an X axis coordinate component at the position of the target 27 fed to the plasma generation region R1.

The second image sensor 47 transmits a signal including the captured image to the control unit 8.

With the images captured by the second image sensor 47, the control unit 8 measures the X axis coordinate component and the Z axis coordinate component at the position of the target 27 fed to the plasma generation region R1. Then, the control unit 8 drives the stage 26 such that the measured position of the target 27 in the X axis direction and the Z axis direction becomes a desired position.

With the image captured by the first image sensor 45, the control unit 8 measures the Y axis coordinate component at the position of the target 27 fed to the plasma generation region R1. Then, the control unit 8 changes the delay time Td with use of Expressions 1 and 2 such that the measured position of the target 27 in the Y axis direction becomes a desired position.

The control unit 8 drives the manipulator 224 such that the target 27 moved to the desired position is appropriately irradiated with the pulse laser light 31.

Next, an EUV light moving process performed by the control unit 8 according to the second embodiment will be described with use of FIGS. 14A and 14B.

Figure 14A:
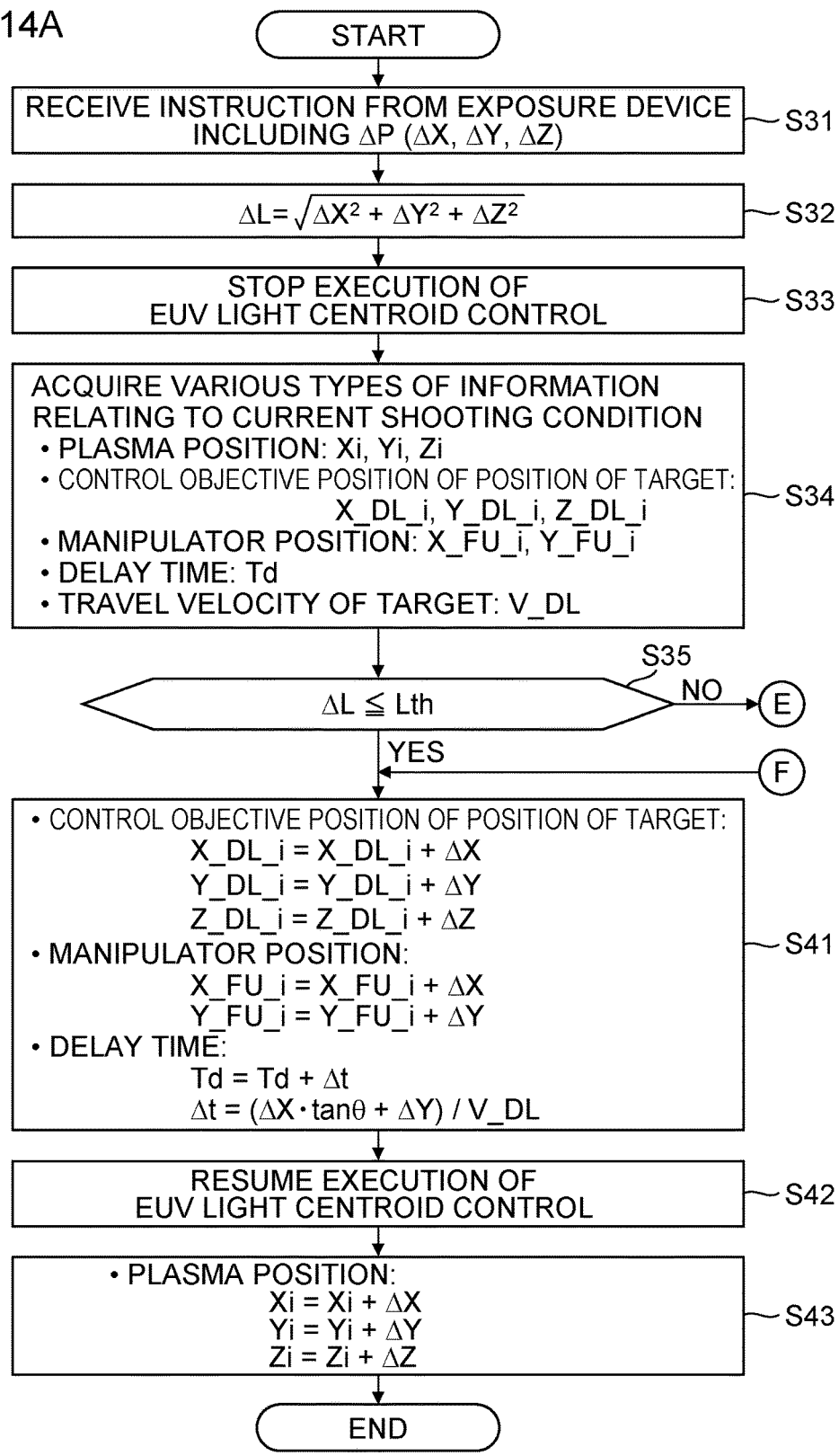
FIGS. 14A and 14B are flowcharts of an EUV light moving process performed by a control unit according to the second embodiment.
Figure 14B:
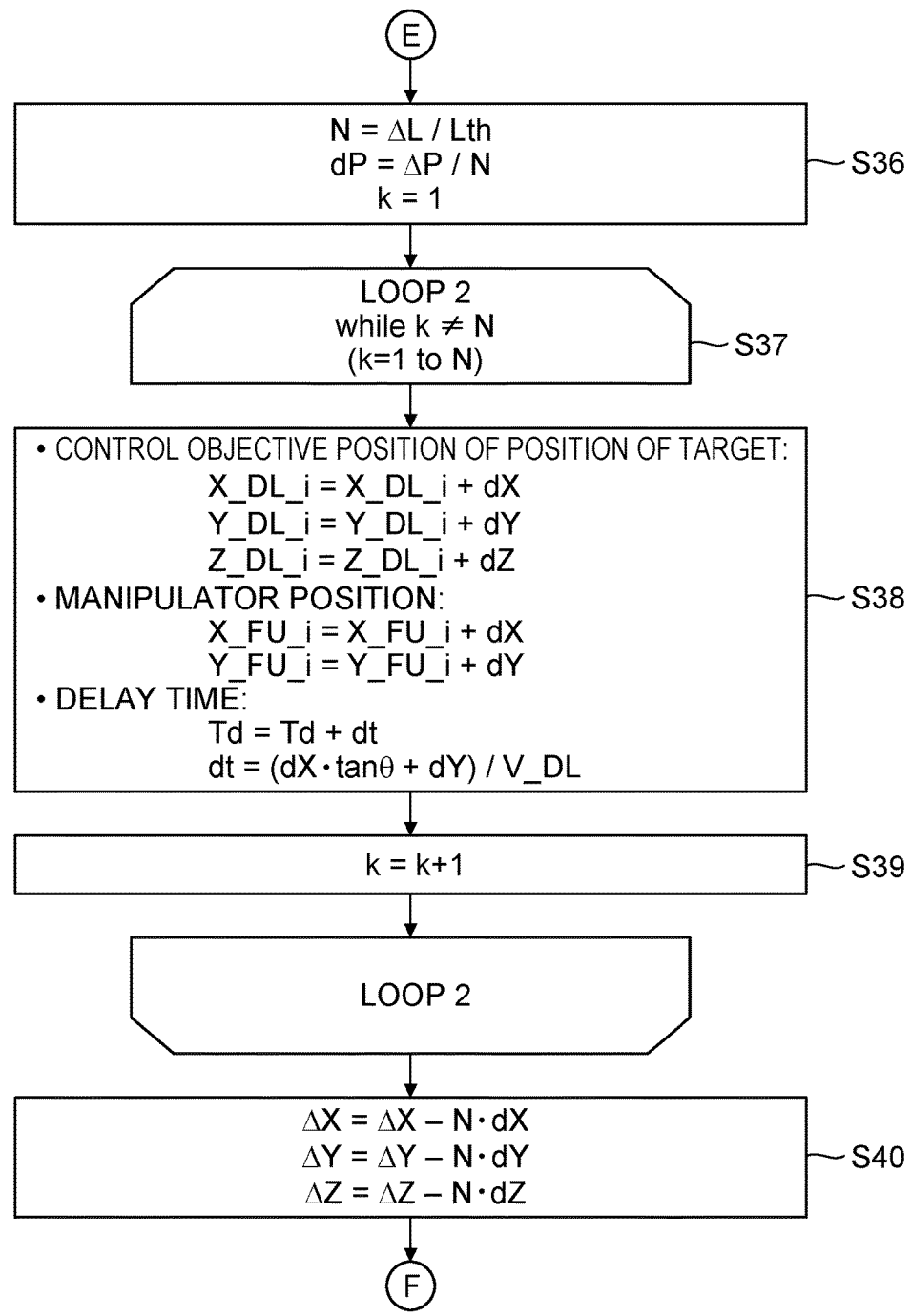

FIGS. 14A and 14B are flowcharts of an EUV light moving process performed by the control unit 8 according to the second embodiment.

When the control unit 8 according to the second embodiment performs the EUV light moving process, the control unit 8 specifies the plasma current position by estimating the position of the target 27, measured by using the images captured by the first image sensor 45 and the second image sensor 47, as the plasma current position.

In the EUV light moving process, the control unit 8 also sets a control objective position of the position of the target 27 fed to the plasma generation region R1, based on the specified plasma current position and a differential value ΔP included in an instruction from the exposure device 9. Then, the control unit 8 controls the stage 26 such that the position of the target 27 fed to the plasma generation region R1 becomes the set control objective position.

A control objective position of the position of the target 27 fed to the plasma generation region R1 is also simply referred to as a control objective position of the position of the target 27.

In steps S31 to S33, the control unit 8 performs the same processes as those of steps S11 to S13 illustrated in FIG. 8A, respectively.

At step S34, the control unit 8 acquires various types of information relating to the current shooting condition.

Specifically, the control unit 8 acquires a current position (Xi, Yi, Zi) of the plasma 275 and a current control objective position (X_DL_i, Y_DL_i, Z_DL_i) of the position of the target 27. In addition, the control unit 8 acquires a current position (X_FU_i, Y_FU_i) of the manipulator 224, current delay time Td, and a travel velocity V_DL of the target.

At that time, the control unit 8 estimates the position of the target 27 measured with use of the images captured by the first and second image sensors 45 and 47 as the current position (Xi, Yi, Zi) of the plasma 275, as described above.

At step S35, the control unit 8 determines whether or not the moving distance ΔL of the plasma 275 is equal to or smaller than the allowable value Lth with use of Expression 6, similar to step S15 illustrated in FIG. 8A.

When the moving distance ΔL of the plasma 275 is equal to or smaller than the allowable value Lth, the control unit 8 proceeds to step S41. Meanwhile, when the moving distance ΔL of the plasma 275 is larger than the allowable value Lth, the control unit 8 proceeds to step S36.

At step S36, the control unit 8 performs the same process as that of step S16 illustrated in FIG. 8B.

At step S37, the control unit 8 performs a loop 2 in which processes of steps S38 and S39 are repeated until the argument k takes N as represented by Expression 10, similar to step S17 illustrated in FIG. 8B.

At step S38, the control unit 8 determines at least one of the change amount of the control objective position of the position of the target 27, the driving amount of the manipulator 224, and the change amount of the delay time Td, with use of dp (dX, dY, dZ), as represented by Expressions 20 to 22.

$X\_DL\_i = X\_DL\_i + dX$ $Y\_DL\_i = Y\_DL\_i + dY$ $Z\_DL\_i = Z\_DL\_i + dZ$ [Expression 20]

$X\_FU\_i = x\_FU\_i + dX$ $Y\_FU\_i = Y\_FU\_i + dY$ [Expression 21]

$Td = Td + dt$ $dt = (dX \cdot \tan\theta + dY)/V\_DL$ [Expression 22]

Specifically, as represented by Expression 20, the control unit 8 determines the change amount of an X axis coordinate component of the control objective position of the position of the target 27 to be dX, determines the change amount of a Y axis coordinate component of the control objective position to be dY, and determines the change amount of a Z axis coordinate component of the control objective position to be dZ. As represented by Expression 21, the control unit 8 determines the driving amount of the manipulator 224 in the X axis direction to be dX, and determines the driving amount of the manipulator 224 in the Y axis direction to be dY. As represented by Expression 22, the control unit 8 determines the amount of change dt of the delay time Td with use of dX and dY.

Then, the control unit 8 drives the stage 26 such that the position of the target 27 fed to the plasma generation region R1 in the X axis direction and the Z axis direction becomes the control objective position (X_DL_i, Z_DL_i) represented by Expression 20. Alternatively, the control unit 8 drives the stage 26 according to the determined change amounts dX and dZ of the control objective position (X_DL_i, Z_DL_i). This means that the control unit 8 drives the stage 26 by determining the control objective position of the position of the target 27 or the amount of change thereof. Accordingly, the driving amount of the stage 26 according to the second embodiment is determined by the change amount of the control objective position of the position of the target 27.

The control unit 8 changes the delay time Td such that the radiation timing of the pulse laser light 31 is defined by the delay time Td as represented by Expression 22, such that the position of the target 27 fed to the plasma generation region R1 in the Y axis direction becomes the control objective position represented by Expression 20.

The control unit 8 drives the manipulator 224 such that the position of the manipulator 224 is moved to the position represented by Expression 21.

The control unit 8 controls the stage 26, the manipulator 224, and the radiation timing at a time, similar to step S18 illustrated in FIG. 8B.

At steps S39 and S40, the control unit 8 performs the same processes as those of steps S19 and S20 illustrated in FIG. 8B, respectively.

At step S41, the control unit 8 determines at least one of the change amount of the control objective position of the position of the target 27, the driving amount of the manipulator 224, and the change amount of the delay time Td, with use of the differential value $\Delta P$ ($\Delta X$, $\Delta Y$, $\Delta Z$), as represented by Expressions 23 to 25.

$$X\_DL\_i = X\_DL\_i + \Delta X$$

$$Y\_DL\_i = Y\_DL\_i + \Delta Y$$

$$Z\_DL\_i = Z\_DL\_i + \Delta Z \qquad \text{[Expression 23]}$$

$$X\_FU\_i = X\_FU\_i + \Delta X$$

$$Y\_FU\_i = Y\_FU\_i + \Delta Y \qquad \text{[Expression 24]}$$

$$Td = Td + \Delta t$$

$$\Delta t = (\Delta X \cdot \tan\theta + \Delta Y)/V\_DL \qquad \text{[Expression 25]}$$

Specifically, as represented by Expression 23, the control unit 8 determines the change amount of the X axis coordinate component of the control objective position of the position of the target 27 to be $\Delta X$, determines the change amount of the Y axis coordinate component of the control objective position to be $\Delta Y$, and determines the change amount of the Z axis coordinate component of the control objective position to be $\Delta Z$. As represented by Expression 24, the control unit 8 determines the driving amount of the manipulator 224 in the X axis direction to be $\Delta X$, and determines the driving amount of the manipulator 224 in the Y axis direction to be $\Delta Y$. As represented by Expression 25, the control unit 8 determines the amount of change $\Delta t$ of the delay time Td with use of $\Delta X$ and $\Delta Y$.

Then, the control unit 8 drives the stage 26 according to the determined change amounts $\Delta X$ and $\Delta Z$ of the control objective position such that the position of the target 27 fed to the plasma generation region R1 in the X axis direction and the Z axis direction becomes the control objective position represented by Expression 23. This means that the control unit 8 determines the driving amount of the stage 26 by determining the change amount of the control objective position of the position of the target 27.

The control unit 8 changes the delay time Td such that the radiation timing of the pulse laser light 31 is defined by the delay time Td as represented by Expression 25, such that the position of the target 27 fed to the plasma generation region R1 in the Y axis direction becomes the control objective position represented by Expression 23.

The control unit 8 drives the manipulator 224 such that the position of the manipulator 224 is moved to the position represented by Expression 24.

The control unit 8 controls the stage 26, the manipulator 224, and the radiation timing at a time, similar to step S21 illustrated in FIG. 8A.

At steps S42 and S43, the control unit 8 performs the same processes as those of steps S22 and S23 illustrated in FIG. 8A, respectively. Then, the control unit 8 ends the process.

The other operations of the EUV light generating apparatus 1 of the second embodiment are the same as those of the EUV light generating apparatus 1 of the first embodiment.

[4.3 Effect]

When the control unit 8 according to the second embodiment performs the EUV light moving process, the control unit 8 actually measures the position of the target 27 fed to the plasma generation region R1, and estimates the measured position of the target 27 as a plasma current position. In this way, the control unit 8 specifies the plasma current position serving as the basis of the EUV light moving process.

As such, in the initial stage of the EUV light moving process, the control unit 8 can perform the EUV light moving process even though the target 27 is not irradiated with the pulse laser light 31. For example, when the EUV light generating apparatus 1 is operated in an operation in which radiation and suspension of radiation of the pulse laser light 31 is repeated frequently such as a burst operation, the control unit 8 can perform the EUV light moving process even when radiation of the pulse laser light 31 is suspended.

Thereby, to enable the EUV light moving process to be executed at an arbitrary timing, the control unit 8 can move the generation position of the EUV light 277 while suppressing shooting deviation even when radiation of the pulse laser light 31 is started during execution of the EUV light moving process.

As a result, the EUV light generating apparatus 1 of the second embodiment can move the generation position of the EUV light 277 in a short time at an arbitrary timing while maintaining the performance of the EUV light 277.

The burst operation is an operation of the EUV light generating apparatus 1 in which a burst emission period during which the EUV light 277 is generated for a predetermined period with a predetermined repetition frequency and a burst suspension period during which generation of the EUV light 277 is stopped for a predetermined period are repeated for a certain period of time. In the burst emission period, radiation of the pulse laser light 31 is performed with a predetermined repetition frequency, while in the burst suspension period, radiation of the pulse laser light 31 is stopped.

5. Third Embodiment

An EUV light generating apparatus 1 of a third embodiment will be described with use of FIGS. 15 to 18.

The EUV light generating apparatus 1 of the third embodiment has a configuration in which the first image sensor 45 is added, instead of the second image sensor 47, to the EUV light generating apparatus 1 of the second embodiment. This means that the EUV light generating apparatus 1 of the third embodiment includes a plurality of first image sensors 45.

Regarding the configurations and operations of the EUV light generating apparatus 1 of the third embodiment, the same configurations and operations as those of the EUV light generating apparatus 1 of the second embodiment are not described repeatedly.

[5.1 Configuration]

Figure 15:
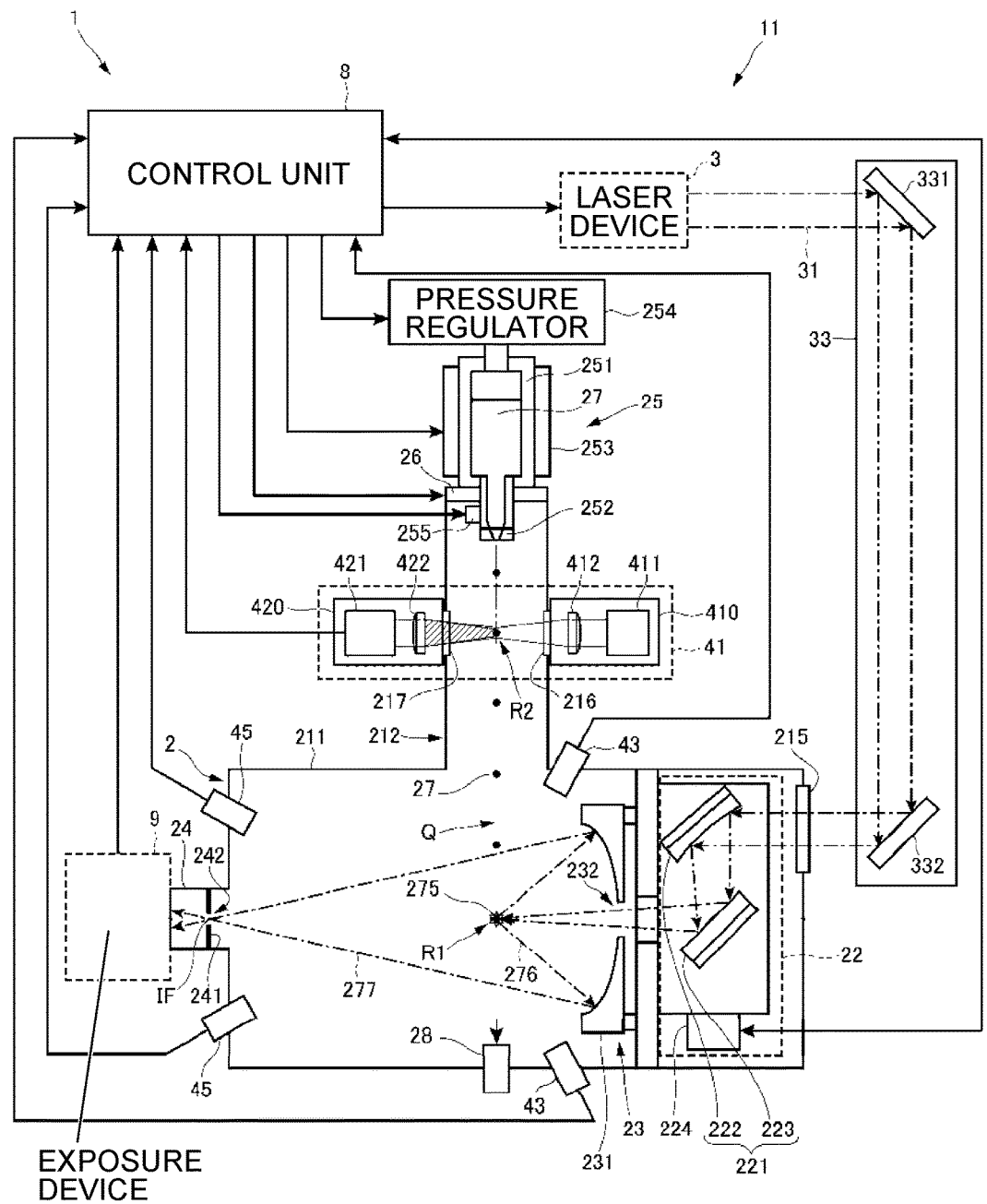
FIG. 15 is a diagram for explaining a configuration of an EUV light generating apparatus of a third embodiment.
Figure 16:
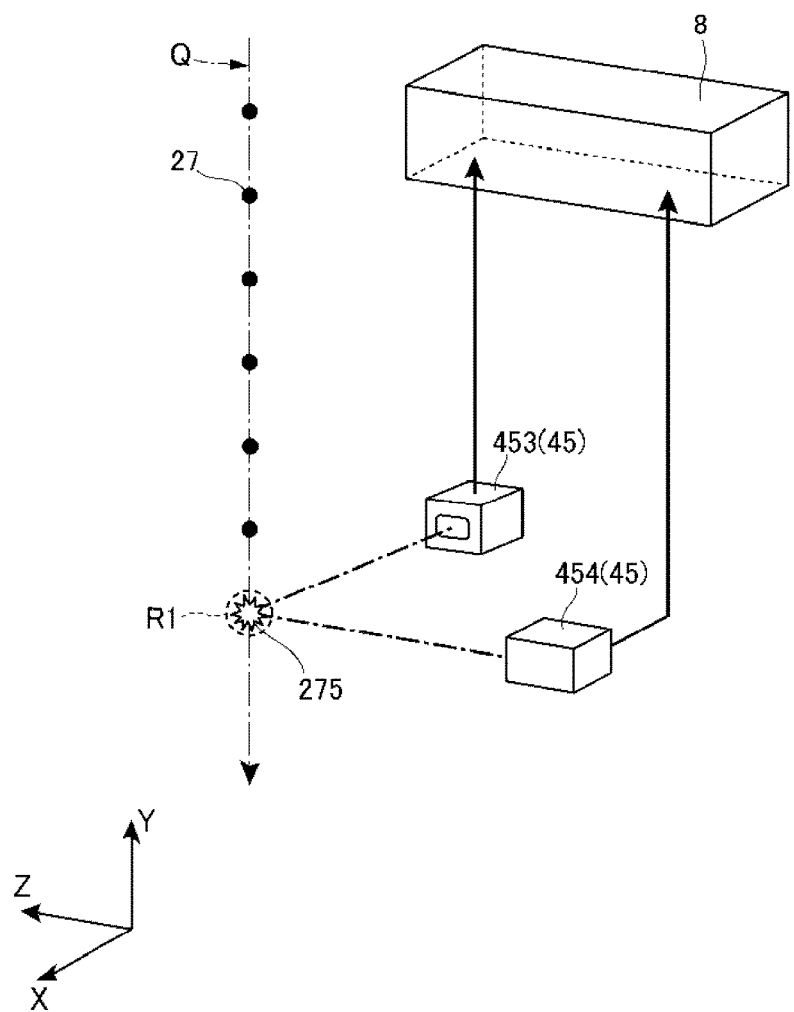
FIG. 16 is a diagram for explaining a configuration of a plurality of first image sensors illustrated in FIG. 15.

FIG. 15 is a diagram for explaining a configuration of the EUV light generating apparatus 1 of the third embodiment. FIG. 16 is a diagram for explaining a configuration of the first image sensors 45 illustrated in FIG. 15.

The first image sensors 45 according to the third embodiment each capture an image of the plasma 275 rather than the target 27 fed to the plasma generation region R1.

Each of the first image sensors 45 according to the third embodiment includes an imaging unit 453 and an imaging unit 454 as illustrated in FIG. 16. Each of the first image sensors 45 according to the third embodiment does not include the illumination unit 451 of the first image sensor 45 according to the second embodiment.

The imaging units 453 and 454 capture images of the plasma 275 from different directions.

Each of the imaging units 453 and 454 has the same configuration as that of the imaging unit 452 included in the first image sensor 45 according to the second embodiment. This means that each of the imaging units 453 and 454 includes a detection element such as a CCD and a shutter such as an IIU.

The imaging units 453 and 454 are disposed such that the respective detection optical axes of the imaging units 453 and 454 pass through the plasma generation region R1 from the same directions that are not parallel to each other. In addition, the imaging units 453 and 454 are disposed such that the respective detection optical axes of the imaging units 453 and 454 are included in a plane almost parallel to the XZ plane. In addition, the imaging units 453 and 454 are disposed such that the respective detection optical axes of the imaging units 453 and 454 cross a plane almost parallel to the YZ plane and a plane almost parallel to the XY plane, respectively. It is preferable that the imaging units 453 and 454 are disposed such that the respective detection optical axes of the imaging units 453 and 454 are substantially orthogonal to a plane almost parallel to the YZ plane and a plane almost parallel to the XY plane, respectively.

The detection optical axis of the imaging unit 453 is an optical path axis of radiation light 276 detected by the imaging unit 453, of the radiation light 276 emitted from the plasma 275.

The detection optical axis of the imaging unit 454 is an optical path axis of the radiation light 276 detected by the imaging unit 454, of the radiation light 276 emitted from the plasma 275.

Each of the imaging units 453 and 454 detects the radiation light 276 emitted from the plasma 275 by exposing it to each detection element to thereby capture an image of the plasma 275. Each of the imaging units 453 and 454 transmits a signal including the captured image to the control unit 8.

Operation of each of the imaging units 453 and 454 is controlled by the control unit 8.

The other components of the EUV light generating apparatus 1 of the third embodiment are the same as those of the EUV light generating apparatus 1 of the second embodiment.

[5.2 Operation]

Operation of the EUV light generating apparatus 1 of the third embodiment will be described.

First, the first image sensors 45 according to the third embodiment and a process performed by the control unit 8 that controls the operation thereof will be described with use of FIGS. 17 and 18.

Figure 17:
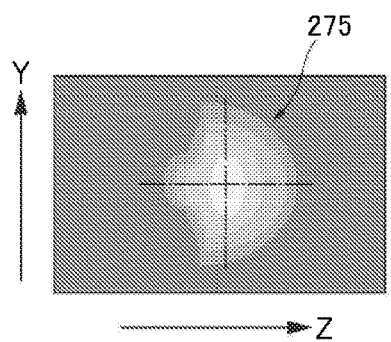
FIG. 17 is a diagram for explaining an image captured by an imaging unit included in a first image sensor illustrated in FIG. 16.

FIG. 17 is a diagram for explaining an image captured by the imaging unit 453 included in the first image sensor 45 illustrated in FIG. 16. FIG. 18 is a diagram for explaining an image captured by the imaging unit 454 included in the first image sensor 45 illustrated in FIG. 16.

The control unit 8 according to the third embodiment transmits a fourth gate signal to the respective first image sensors 45 at a time such that images of the plasma 275 can be captured appropriately.

The fourth gate signal is a signal that gives, to each of the first image sensors 45, a trigger to capture an image of the plasma 275. The fourth gate signal is a signal for exposing the detection element of each of the imaging units 453 and 454 by allowing the shutter of each of the imaging units 453 and 454 to open for the time width thereof to thereby enable an image to be captured.

Specifically, the control unit 8 transmits the fourth gate signal at the timing delayed by a predetermined delay time from the timing of generating a target detection signal such that the shutter opens at the timing when the plasma 275 is generated from the target 27 corresponding to the target detection signal. The control unit 8 outputs the fourth gate signal having a predetermined time width such that the shutter is open in a period of time when the plasma 275 generated from the target 27 corresponding to the target detection signal emits light.

When each of the first image sensors 45 according to the third embodiment receives the fourth gate signal, each of them captures an image of the plasma 275. For example, as illustrated in FIG. 17, the imaging unit 453 included in the first image sensor 45 captures an image in which a Y axis coordinate component and a Z axis coordinate component at the position of the plasma 275 can be measured. As illustrated in FIG. 18, the imaging unit 454 included in the first image sensor 45 captures an image in which an X axis coordinate component and a Y axis coordinate component at the position of the plasma 275 can be measured.

The radiation light 276 emitted from the plasma 275 is pulse light having high luminance and a short time width. Accordingly, the time width of the fourth gate signal can be short corresponding to the time width of the radiation light 276. When the time width of the fourth gate signal is short, the exposure time of the detection element of each of the imaging unit 453 and 454 is shortened.

Figure 18:
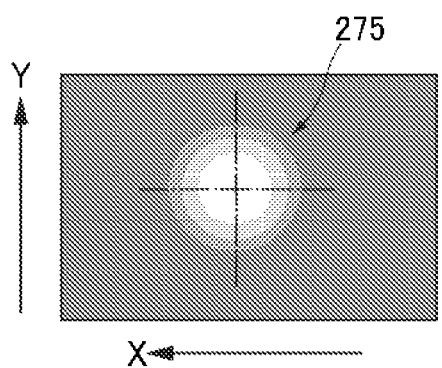
FIG. 18 is a diagram for explaining an image captured by the imaging unit included in the first image sensor illustrated in FIG. 16.

Accordingly, as illustrated in FIGS. 17 and 18, the imaging units 453 and 454 included in the first image sensors 45 can capture still images of the plasma 275. With the still images illustrated in FIGS. 17 and 18, the control unit 8 can measure respective coordinate components at the position of the plasma 275 generated at a certain time.

Each of the first image sensors 45 transmits a signal including the captured image to the control unit 8.

With the images captured by the first image sensors 45, the control unit 8 measures the respective coordinate components at the position of the plasma 275. Then, the control unit 8 drives the stage 26 and the manipulator 224 and changes the delay time Td so as to allow the measured position of the plasma 275 to be a desired position.

Next, an EUV light moving process performed by the control unit 8 according to the third embodiment will be described.

The EUV light moving process performed by the control unit 8 according to the third embodiment is the same as the EUV light moving process performed by the control unit 8 according to the second embodiment illustrated in FIGS. 14A and 14B.

This means that when the control unit 8 according to the third embodiment performs the EUV light moving process, the control unit 8 specifies the plasma current position with use of the images captured by the first image sensors 45. In the EUV light moving process, the control unit 8 also sets a control objective position of the position of the target 27 fed to the plasma generation region R1, based on the specified plasma current position and a differential value ΔP included in an instruction from the exposure device 9. Then, the control unit 8 controls the stage 26 such that the position of the target 27 fed to the plasma generation region R1 becomes the set control objective position.

Here, the control unit 8 according to the third embodiment directly specifies the plasma current position from the position of the plasma 275 measured with use of the images captured by the first image sensors 45, at step S34 of FIG. 14A.

The other operations of the EUV light generating apparatus 1 of the third embodiment are the same as those of the EUV light generating apparatus 1 of the second embodiment.

[5.3 Effect]

The control unit 8 according to the third embodiment specifies the plasma current position serving as the basis of the EUV light moving process by directly measuring the position of the plasma 275, when performing the EUV light moving process.

Thereby, the EUV light generating apparatus 1 of the third embodiment can move the generation position of the EUV light 277 with higher accuracy while suppressing shooting deviation.

6. Fourth Embodiment

An EUV light generating apparatus 1 of a fourth embodiment will be described with use of FIGS. 19A and 19B.

The EUV light generating apparatus 1 of the fourth embodiment has the same configuration as that of the EUV light generating apparatus 1 of the first, second, or third embodiment.

However, the EUV light generating apparatus 1 of the fourth embodiment is different from the EUV light generating apparatus 1 of the first, second, or third embodiment in the operation of the control unit 8 in the EUV light moving process.

Regarding the configurations and operations of the EUV light generating apparatus 1 of the fourth embodiment, the same configurations and operations as those of the EUV light generating apparatus 1 of the first, second, or third embodiment are not described repeatedly.

Figure 19B:
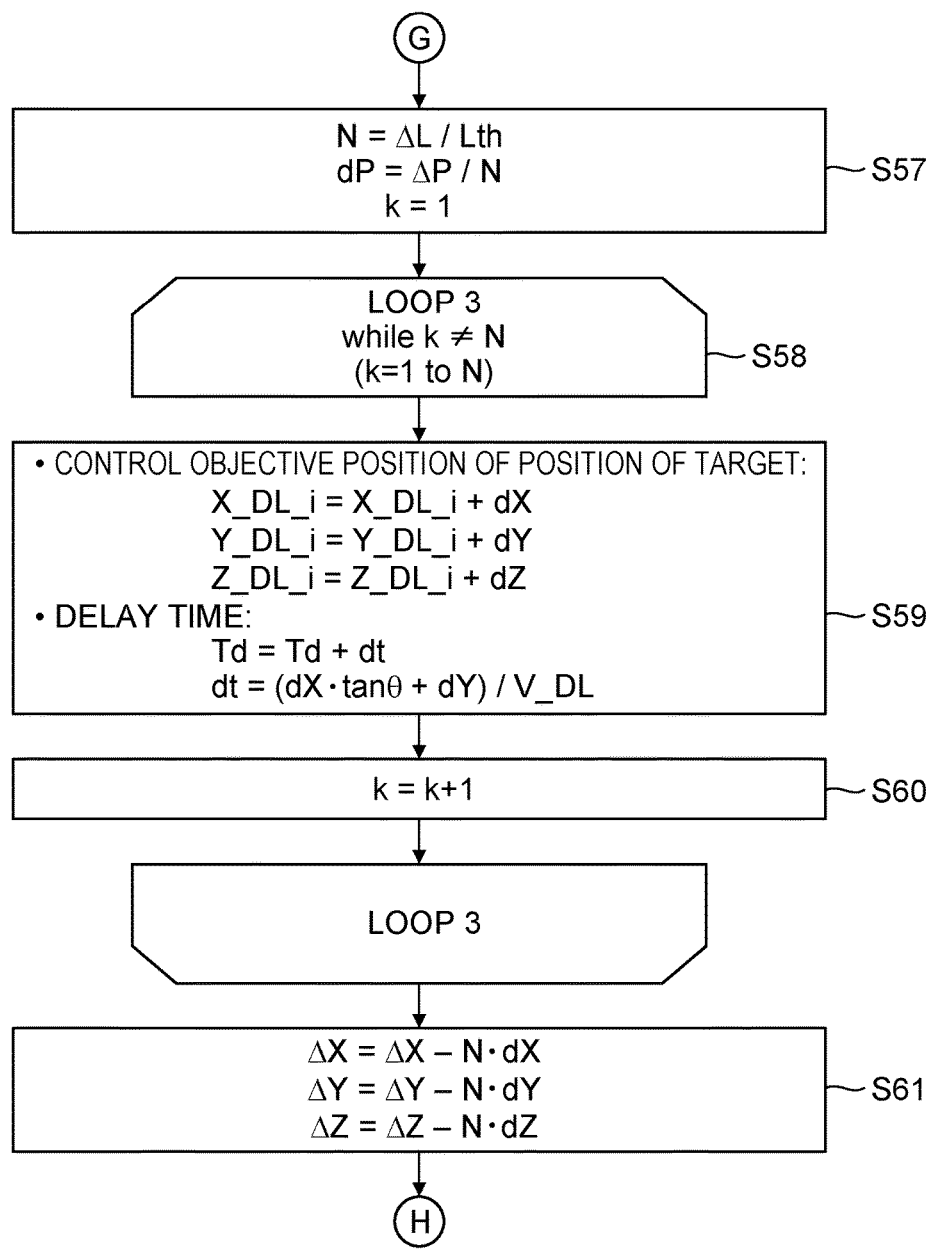

FIGS. 19A and 19B are flowcharts of an EUV light moving process performed by the control unit 8 according to the fourth embodiment.

When the control unit 8 according to the fourth embodiment controls the manipulator 224 in the EUV light moving process, the control unit 8 performs control of the manipulator 224 as part of the EUV light centroid control. This means that when the control unit 8 controls the manipulator 224 in the EUV light moving process, the control unit 8 controls the manipulator by performing the EUV light centroid control.

At steps S51 and S52, the control unit 8 performs the same processes as those of steps S11 and S12 illustrated in FIG. 8A, respectively.

At step S53, the control unit 8 determines whether or not the EUV light centroid control is being performed.

When the EUV light centroid control is being performed, the control unit 8 proceeds to step S55. Meanwhile, when the EUV light centroid control is not being executed, the control unit 8 proceeds to step S54.

At step S54, the control unit 8 performs the EUV light centroid control.

When executing the EUV light centroid control, the control unit 8 stores an objective centroid position (EUV-Cent_Xi, EUV-Cent_Yi) of the EUV light 277.

At step S55, the control unit 8 acquires various types of information relating to the current shooting condition.

Specifically, the control unit 8 acquires a current position (Xi, Yi, Zi) of the plasma 275, a current control objective position (X_DL_i, Y_DL_i, Z_DL_i) of the position of the target 27, a current delay time Td, and a travel velocity V_DL of the target 27.

At that time, the control unit 8 performs control of the manipulator 224 as part of the EUV light centroid control. Therefore, the control unit 8 does not need to acquire the current position (X_FU_i, Y_FU_i) of the manipulator 224.

Further, the control unit 8 defines the position of the plasma 275 held by the control unit 8 at the time of starting the EUV light moving process as the current position (Xi, Yi, Zi) of the plasma 275, similar to the first embodiment. Alternatively, the control unit 8 estimates the position of the target 27 measured with use of the images captured by the first and second image sensors 45 and 47 as the current position (Xi, Yi, Zi) of the plasma 275, similar to the second embodiment. Alternatively, the control unit 8 defines the position of the plasma 275 measured with use of the images captured by the first image sensors 45 as the current position (Xi, Yi, Zi) of the plasma 275, similar to the third embodiment.

At step S56, the control unit 8 determines whether or not the moving distance ΔL of the plasma 275 is equal to or smaller than the allowable value Lth with use of Expression 6, similar to step S15 illustrated in FIG. 8A.

When the moving distance ΔL of the plasma 275 is equal to or smaller than the allowable value Lth, the control unit 8 proceeds to step S62. Meanwhile, when the moving distance ΔL of the plasma 275 is larger than the allowable value Lth, the control unit 8 proceeds to step S57.

At step S57, the control unit 8 performs the same process as that of step S16 illustrated in FIG. 8B.

At step S58, the control unit 8 performs a loop 3 in which processes of steps S59 and S60 are repeated until the argument k takes N as represented by Expression 10, similar to step S17 illustrated in FIG. 8B.

At step S59, the control unit 8 determines at least one of the change amount of the control objective position of the position of the target 27 and the change amount of the delay time Td, with use of dp (dX, dY, dZ), as represented by Expressions 26 and 27.

$$X\_DL\_i = X\_DL\_i + dX$$

$$Y\_DL\_i = Y\_DL\_i + dY$$

$$Z\_DL\_i = Z\_DL\_i + dZ$$ [Expression 26]

$$Td = Td + dt$$

$$dt = (dX \cdot \tan\theta + dY)/V\_DL$$ [Expression 27]

Specifically, as represented by Expression 26, the control unit 8 determines the change amount of an X axis coordinate component of the control objective position of the position of the target 27 to be dX, determines the change amount of a Y axis coordinate component of the control objective position to be dY, and determines the change amount of a Z axis coordinate component of the control objective position to be dZ. As represented by Expression 27, the control unit 8 determines the amount of change dt of the delay time Td with use of dX and dY.

Then, the control unit 8 drives the stage 26 according to the determined control objective position or the amounts of change dX and dZ of the control objective position such that the position of the target 27 fed to the plasma generation region R1 in the X axis direction and the Z axis direction becomes the control objective position represented by Expression 26.

The control unit 8 changes the delay time Td such that the radiation timing of the pulse laser light 31 is defined by the delay time Td represented by Expression 27, such that the position of the target 27 fed to the plasma generation region R1 in the Y axis direction becomes the control objective position represented by Expression 26.

The control unit 8 controls the stage 26 and the radiation timing at a time, similar to step S18 illustrated in FIG. 8B.

Further, the control unit 8 performs control of the manipulator 224 as part of the EUV light centroid control as described above. Accordingly, at step S59, the control unit 8 does not need to determine the driving amount of the manipulator 224 to drive the manipulator 224.

When the control objective position of the position of the target 27 and the delay time Td are changed to move the position of the plasma 275 by the allowable value Lth, the centroid position of the EUV light 277 is changed. At that time, as the EUV light centroid control is being performed, the control unit 8 automatically detects a change of the centroid position of the EUV light 277, and automatically drives the manipulator 224 to eliminate deviation between the centroid position of the EUV light 277 and the objective centroid position.

Meanwhile, distances that can be taken between the respective EUV light sensors 43a to 43c and the position of the plasma 275 range from 200 mm to 500 mm. Meanwhile, the moving distance ΔL of the plasma 275 is 1.5 mm or shorter, and the allowable value Lth is 30 μm or smaller. This means that the moving distance ΔL of the plasma 275 and the allowable value Lth are significantly smaller than the respective distances between the respective EUV light sensors 43a to 43c and the position of the plasma 275. As such, a change of the centroid position of the EUV light 277 detected by the control unit 8 along with movement of the position of the plasma 275 is extremely small.

Accordingly, at step S59, when the control unit 8 performs control of the manipulator 224 as part of the EUV light centroid control, the control unit 8 does not need to change the objective centroid position of the EUV light 277.

At steps S60 and S61, the control unit 8 performs the same processes as those of steps S19 and S20 illustrated in FIG. 8B, respectively.

At step S62, the control unit 8 determines at least one of the change amount of the control objective position of the position of the target 27 and the change amount of the delay time Td, with use of the differential value ΔP (ΔX, ΔY, ΔZ), as represented by Expressions 28 and 29.

$$X\_DL\_i = X\_DL\_i + \Delta X$$

$$Y\_DL\_i = Y\_DL\_i + \Delta Y$$

$$Z\_DL\_i = Z\_DL\_i + \Delta Z$$ [Expression 28]

$$Td = Td + \Delta t$$

$$\Delta t = (\Delta X \cdot \tan\theta + \Delta Y)/V\_DL$$

Specifically, as represented by Expression 28, the control unit 8 determines the change amount of the X axis coordinate component of the control objective position of the position of the target 27 to be ΔX, determines the change amount of the Y axis coordinate component of the control objective position to be ΔY, and determines the change amount of the Z axis coordinate component of the control objective position to be ΔZ. As represented by Expression 29, the control unit 8 determines the amount of change Δt of the delay time Td with use of ΔX and ΔY.

Then, the control unit 8 drives the stage 26 according to the determined change amounts ΔX and ΔZ of the control objective position such that the position of the target 27 fed to the plasma generation region R1 in the X axis direction and the Z axis direction becomes the control objective position represented by Expression 28.

The control unit 8 changes the delay time Td such that the radiation timing of the pulse laser light 31 is defined by the delay time Td represented by Expression 29, such that the position of the target 27 fed to the plasma generation region R1 in the Y axis direction becomes the control objective position represented by Expression 28.

The control unit 8 controls the stage 26 and the radiation timing at a time, similar to step S21 illustrated in FIG. 8A.

Further, at step S62, the control unit 8 does not need to determine the driving amount of the manipulator 224 to drive the manipulator 224, similar to step S59. In addition, the control unit 8 does not need to change the objective centroid position of the EUV light 277, similar to step S59.

At step S63, the control unit 8 performs the same process as that of step S23 illustrated in FIG. 8A. Then, the control unit 8 ends the process.

The other operations of the EUV light generating apparatus 1 of the fourth embodiment are the same as those of the EUV light generating apparatus 1 of the first, second, or third embodiment.

As the control unit 8 according to the fourth embodiment performs the EUV light centroid control in parallel with the EUV light moving process, the relative positional relation between the position of the target 27 fed to the plasma generation region R1 and the light condensing position of the pulse laser light 31 is not required to be regulated slightly after the EUV light moving process.

Thereby, the EUV light generating apparatus 1 of the fourth embodiment can move the generation position of the EUV light 277 while suppressing shooting deviation immediately.

7. Fifth Embodiment

In the first embodiment illustrated in FIGS. 8A and 8B to the third embodiment illustrated in FIGS. 14A and 14B, in the EUV light emission position control, the plasma position is moved after the EUV light centroid control is suspended. On the other hand, in the fourth embodiment illustrated in FIGS. 19A and 19B, in the EUV light emission position control, the plasma position is moved in a state where the EUV light centroid control is continued.

The EUV light emission position control may be applied to an EUV light generating apparatus using a pre-pulse laser. In that case, the EUV light centroid control may be performed by disposing a mirror holder having a mirror driving unit on the optical path of the pre-pulse laser and moving a mirror for the pre-pulse laser.

Further, a condensing mirror driving unit that drives the laser light condensing optical system 22 may be provided, and auxiliary control to move the laser light condensing optical system 22 may be performed.

The mirror driving unit may move the light condensing position of the pre-pulse laser radiated to the target 27 in a region where the plasma 275 is generated on the XY plane, for example.

Here, as pre-pulse laser light is for dispersing the target 27, the output may be lowered compared with the main pulse laser light for generating EUV light. This means that as for a mirror for the pre-pulse laser, output can be regulated to a level not requiring a cooling mechanism. Therefore, the mirror driving unit may have a higher response speed than that of the condensing mirror driving unit. As the mirror driving unit and the condensing mirror driving unit, an actuator may be used. In the below description, a mirror driving unit is also referred to as a high-speed actuator. Accordingly, it is possible to perform relatively high-speed EUV light centroid control by driving only a mirror for pre-pulse laser light, and perform auxiliary control by driving the laser light condensing optical system 22. In the below description, relatively high-speed EUV light centroid control is referred to as high-speed centroid control, and auxiliary control for maintaining the high-speed centroid control is referred to as centroid auxiliary control. In the present embodiment, centroid auxiliary control may be performed each time high-speed centroid control is performed a plurality of times (N times).

In the case where an EUV light generation system 11 includes a plurality of pre-pulse laser devices, high-speed centroid control may be performed only on pre-pulse laser light that is radiated to the target 27 first. This is because pre-pulse laser light that is radiated to the target 27 first largely affects the change of the centroid position of the EUV light. High-speed centroid control may also be performed on pre-pulse laser light other than the pre-pulse laser light radiated to the target 27 first, by providing a mirror driving unit on the optical path thereof.

[7.1 Configuration]

Next, an example of an EUV light generating apparatus having two pre-pulse laser devices will be described with reference to FIGS. 20 and 21. In the below description, the same components as those in the aforementioned respective embodiments are denoted by the same reference signs and the description thereof is omitted. In the below description, some of the same components as those in the aforementioned respective embodiments are not illustrated in the drawings and the description thereof is omitted.

Figure 20:
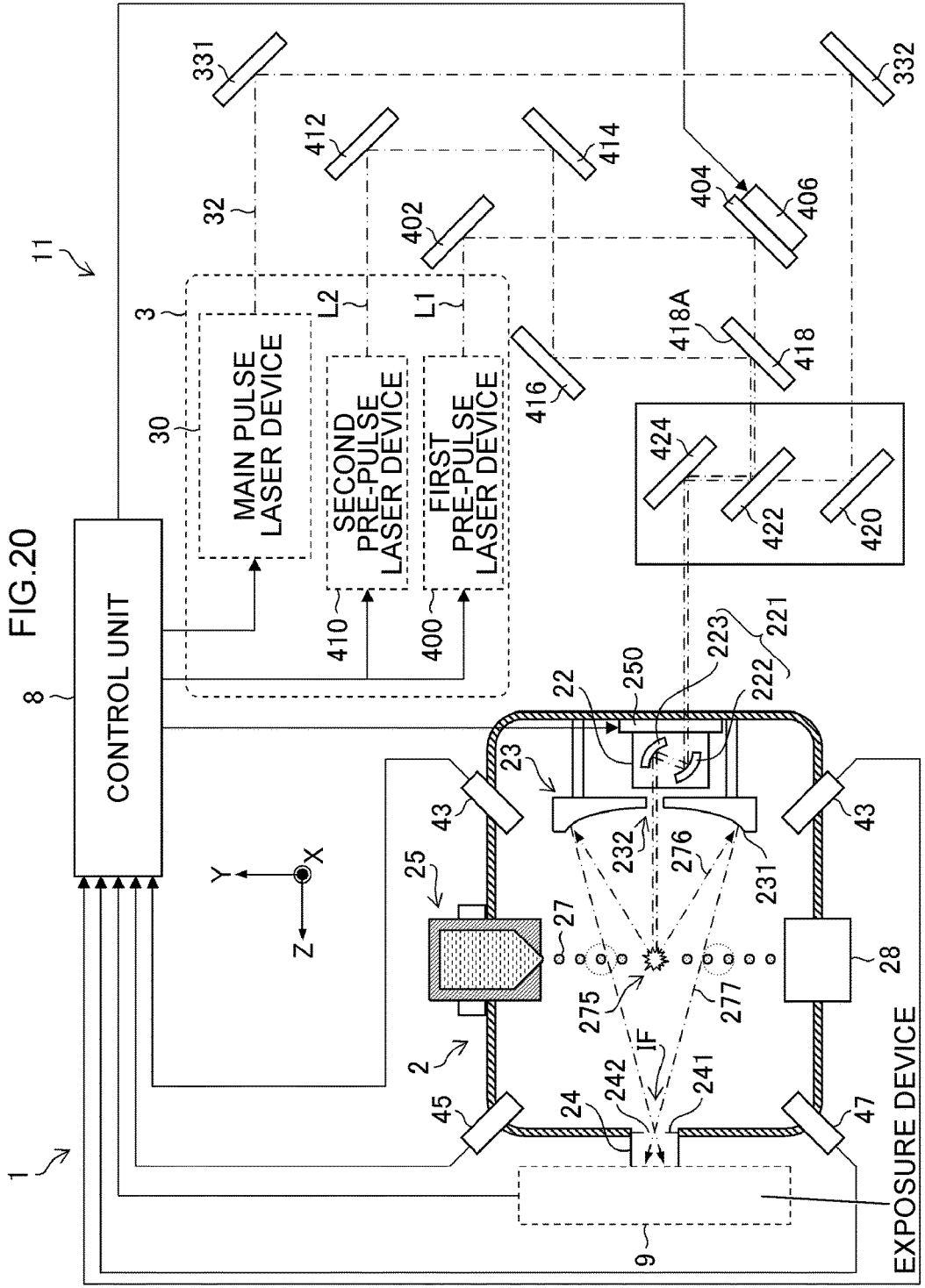
FIG. 20 is a diagram for explaining a configuration of an EUV light generating apparatus according to a fifth embodiment.

FIG. 20 is a diagram for explaining a configuration of an EUV light generating apparatus according to the fifth embodiment of the present invention. In the below description, an XYZ orthogonal coordinate system in which a target dropping direction is a Y axis direction is used.

As illustrated in FIG. 20, a laser device 3 of the EUV light generation system 11 may include a main pulse laser device 30 that outputs main pulse laser light 32, a first pre-pulse laser device 400, and a second pre-pulse laser device 410.

The first pre-pulse laser device 400 is a laser light source that radiates pre-pulse laser light L1 having a wavelength of 1.06 μm and a pulse width of less than 1 ns, for example.

The second pre-pulse laser device 410 is a laser light source that radiates pre-pulse laser light L2 having the same wavelength as that of the first pre-pulse laser device 400 and a pulse width of 1 ns or larger, for example.

The pre-pulse laser light L1 radiated from the first pre-pulse laser device 400 may be reflected sequentially by high reflective mirrors 402 and 404 and pass through a pre-pulse beam combiner 418. The pre-pulse laser light L1 passing through the pre-pulse beam combiner 418 may be reflected sequentially by a beam combiner 422 and a high reflective mirror 424. Then, the pre-pulse laser light L1 may be made incident on the laser light condensing optical system 22. The pre-pulse laser light L1 made incident on the laser light condensing optical system 22 may be reflected sequentially by an off-axis parabolic mirror 222 and a high reflective mirror 223 to be radiated to the target 27. Thereby, a secondary target in a state where small droplets are dispersed in a space is generated.

The high reflective mirror 404 may be mounted on a mirror holder 406. The mirror holder 406 may have a mirror driving unit for moving the high reflective mirror 404 and adjusting the angle of the high reflective mirror 404. As the mirror driving unit, an actuator may be used.

The pre-pulse laser light L2 radiated from the second pre-pulse laser device 410 may be reflected sequentially by high reflective mirrors 412, 414, and 416 and the pre-pulse beam combiner 418. The pre-pulse laser light L2 may be reflected sequentially by the beam combiner 422 and the high reflective mirror 424 to be made incident on the laser light condensing optical system 22. The pre-pulse laser light L2 made incident on the laser light condensing optical system 22 may be reflected sequentially by the off-axis parabolic mirror 222 and the high reflective mirror 223 to be radiated to the secondary target. Thereby, a tertiary target in which fine particles are dispersed in a space more uniformly compared with the secondary target, is generated.

The main pulse laser device 30 irradiates the tertiary target generated by the pre-pulse laser light L2 with the main pulse laser light 32. Thereby, EUV light is generated.

The pre-pulse beam combiner 418 may be disposed such that an optical path of the pre-pulse laser light L1 passing through the pre-pulse beam combiner 418 and an optical path of the pre-pulse laser light L2 reflected by the pre-pulse beam combiner 418 almost coincide with each other.

The pre-pulse beam combiner 418 may include a member that transmits laser light. In the pre-pulse beam combiner 418, a surface on which the pre-pulse laser light L1 is made incident, and a surface from which the pre-pulse laser light L1 is output may be coated with a film having a property of high transmittance with respect to the pre-pulse laser light L1. A surface of a pre-pulse beam combiner 461, on which the pre-pulse laser light L2 is made incident, may be coated with a film having high reflectance with respect to the pre-pulse laser light L2. Here, high transmittance means transmitting light at a relatively high transmittance, and high reflectance means reflecting light at a relatively high reflectance.

A surface 418A of the pre-pulse beam combiner 418, from which the pre-pulse laser light L1 is output and on which the pre-pulse laser light L2 is reflected, may be configured such that polarization directions of the pre-pulse laser light L1 and the pre-pulse laser light L2 may be orthogonal to each other or non-parallel to each other. In that case, the pre-pulse beam combiner 418 may include a polarized beam splitter.

The beam combiner 422 may be disposed such that the optical paths of the pre-pulse laser light L1 and the pre-pulse laser light L2 in which the optical paths almost coincide with each other by the pre-pulse beam combiner 418, and the optical path of the main pulse laser light 32 almost coincide with each other. The beam combiner 422 may be a dichroic mirror having a high reflectance with respect to the wavelengths of the pre-pulse laser light L1 and the pre-pulse laser light L2 and having a high transmittance with respect to the wavelength of the main pulse laser light 32.

As described above, the pre-pulse laser light L1 is radiated to the target 27 in a droplet state, and the pre-pulse laser light L2 is radiated to the secondary target in which the target 27 is dispersed. At that time, the diameter of the target 27 in a droplet state is smaller than the size of the dispersed region of the secondary target. Accordingly, the beam diameter when the pre-pulse laser light L1 is radiated to the target 27 may be smaller than the beam diameter when the pre-pulse laser light L2 is radiated to the secondary target.

Further, the main pulse laser light 32 may be radiated to the tertiary target at the timing that the fine particles are not dispersed much. In that case, the beam diameter when the pre-pulse laser light L2 is radiated to the secondary target may be almost equal to or larger than the beam diameter when the main pulse laser light 32 is radiated to the tertiary target.

The control unit 8 may control the actuator of the mirror holder 406 such that a value of the centroid position of the EUV light, detected based on an output of the EUV light sensor 43, falls within a predetermined range. The control unit 8 may regulate the condensing mirror driving unit so as to solve the deviation between an average swing angle of the actuator of the mirror holder 406 and an objective value of the swing angle of the actuator of the mirror holder 406. Hereinafter, the condensing mirror driving unit is referred to as a focus unit (FU) actuator 250. The FU actuator 250 corresponds to the manipulator 224 of the aforementioned respective embodiments. Accordingly, the condensing mirror driving unit is one aspect of the manipulator 224.

As the high reflective mirror 404 is used for reflecting the pre-pulse laser light L1 of a relatively low output of a level not requiring cooling, the high reflective mirror 404 may have a small load and a high resonance frequency. The resonance frequency may be 1 kHz or higher but 10 kHz or lower, for example. Further, the diameter of the target 27 in a droplet state fed from the target feeder 25 to the chamber 2 ranges from 1 μm to several ten for example. Accordingly, it is only necessary that the actuator used for driving the high reflective mirror 404 can move the radiation position of the pre-pulse laser light L1 in the region where the plasma 275 is generated, by a distance corresponding to the diameter of a droplet on the XY plane, that is, several ten for example. As such, the response speed of the actuator used for driving the high reflective mirror 404 may be 0.5 ms or higher but 10 ms or lower, or may be 1 ms or higher but 3 ms or lower, for example.

On the other hand, as the laser light condensing optical system 22 receives a high output $CO_2$ laser reaching several tens of kW, the weight of the mirror cooling structure is large. Further, the diameter of the secondary target dispersed by the pre-pulse laser light L1 and the diameter of the tertiary target dispersed by the pre-pulse laser light L2 are several hundred μm. Accordingly, it is only necessary that the FU actuator 250 can move the laser light radiation position several hundred μm to several mm on the XY plane. Therefore, the response speed of the FU actuator 250 is about 100 ms.

The control unit 8 may change the execution frequency of the high-speed centroid control and the centroid auxiliary control, depending on the relationship between the response speed of the actuator of the mirror holder 406 and that of the FU actuator 250.

[7.2 Operation]

Figure 21:
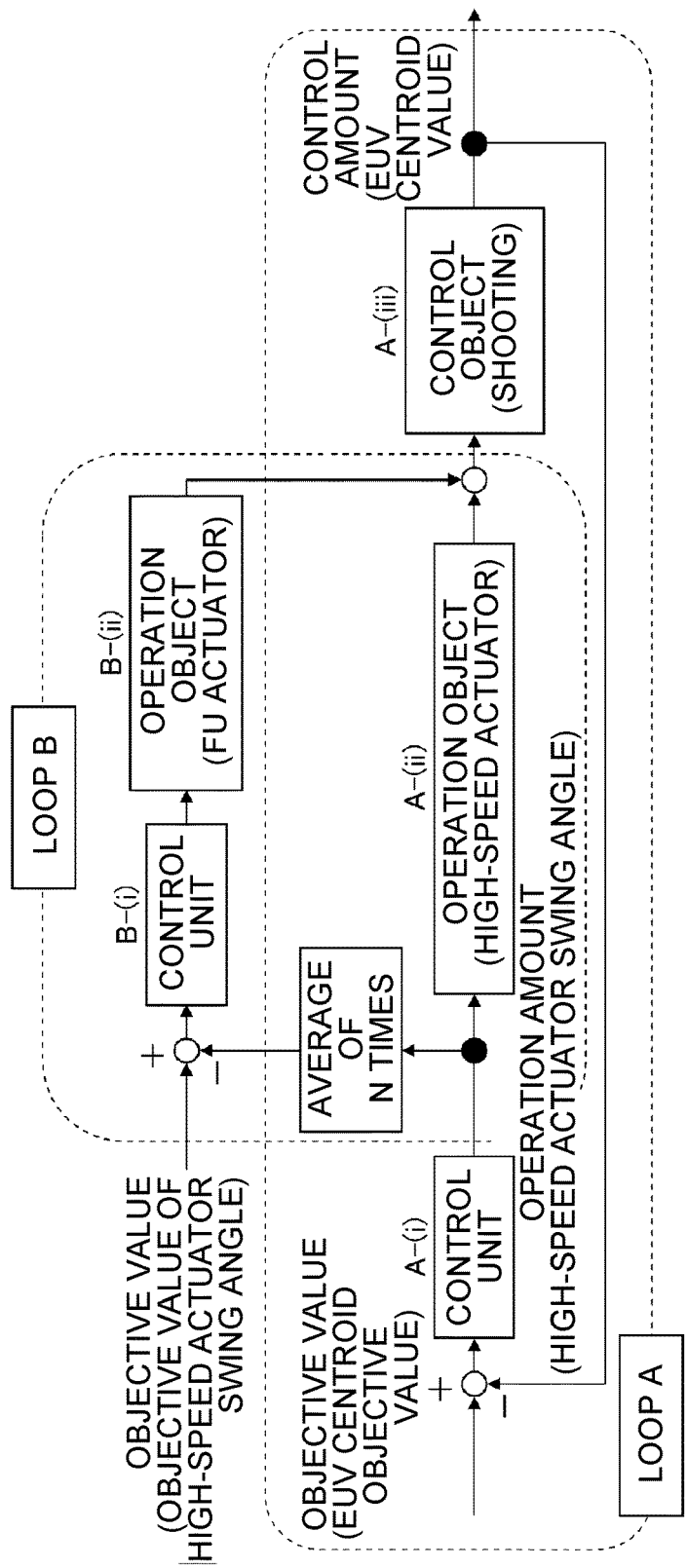
FIG. 21 is a diagram for explaining a flow of EUV light centroid control of an EUV light moving process performed by a control unit according to the fifth embodiment.

FIG. 21 is a block diagram for explaining a flow of EUV light centroid control in the EUV light moving process performed by the control unit according to the fifth embodiment.

As illustrated in FIG. 21, the EUV light centroid control according to the fifth embodiment is expressed in a block diagram including a loop A and a loop B each of which is performed by the control unit 8.

The control unit 8 performs the loop A at higher frequency than that of the loop B. The execution frequency of the loop A and the loop B may be determined based on the response speed of the FU actuator 250 and that of the actuator of the mirror holder 406, or a response speed ratio thereof, for example. The control unit 8 may perform centroid auxiliary control once each time high-speed centroid control is performed a plurality of times (N times). Here, it is acceptable that N=10 to 200, or N=100.

Details of the loops A and B will be described below.

In the loop A, the control unit 8 controls the centroid position of the EUV light by driving the high reflective mirror 404. The loop A includes an operation of high-speed centroid control.

In A-(i) of FIG. 21, the control unit 8 may calculate a relative positional relation between the target 27 in a droplet state and the laser light, based on a deviation between a measurement value of the centroid position of the EUV light by the EUV light sensor 43 and an objective value of the centroid position of the EUV light. Then, the control unit 8 may calculate the swing angle of the actuator of the mirror holder 406 in a direction in which the centroid position of the EUV light takes a predetermined value. Here, an objective value of the centroid position of the EUV light may be set such that the region where the tertiary target is dispersed is included in, or almost coincides with, a range irradiated with the main pulse laser light 32.

In A-(ii) of FIG. 21, the control unit 8 may control the actuator of the mirror holder 406 to move it in a direction in which the swing angle of the high reflective mirror 404 becomes the swing angle calculated by the control unit 8.

In A-(iii) of FIG. 21, the control unit 8 may irradiate the target 27 with the pre-pulse laser light L1, the pre-pulse laser light L2, and the main pulse laser light 32, that is, perform shooting.

The control unit 8 may output, to the EUV light sensor 43, a gate signal delayed by a predetermined time to with respect to a detection signal of the target 27 by the target detection sensor 41. The EUV light sensor 43 may detect desired EUV pulse light in accordance with a gate signal received by the control unit 8. Here, the predetermined time to may be calculated experimentally based on the time required for generating the EUV light from detection of the target 27, for example. The control unit 8 may calculate the centroid position of the EUV light according to the calculation formulas of the centroid position of the EUV light of [Expression 3] and [Expression 4]. Thereby, a result of changing the relative positional relation between the droplet and the laser light, by changing the swing angle of the actuator of the mirror holder 406, may be detected as the centroid position of the EUV light.

In the loop B, the control unit 8 may perform position control of the FU actuator 250 in such a manner as to maintain the control range of the actuator of the mirror holder 406. The loop B includes an operation of centroid auxiliary control.

In B-(i) of FIG. 21, the control unit 8 may detect an objective value and a current value of the swing angle of the actuator of the mirror holder 406. The control unit 8 may calculate the moving amount of the FU actuator 250 so as to solve the deviation between the objective value and the current value of the swing angle of the actuator of the mirror holder 406. Here, as the current value, an average value of the control amounts, for N times, of the actuator of the mirror holder 406 may be used, for example.

In B-(ii) of FIG. 21, the control unit 8 may drive the FU actuator 250 so as to solve the deviation between the objective value and the current value of the swing angle of the actuator of the mirror holder 406. The moving speed of the FU actuator 250 is slower compared with that of the actuator of the mirror holder 406. As such, it is also possible to execute the loop A a plurality of times even during movement of the FU actuator 250. This means that the deviation of the centroid position of the EUV light, generated by driving of the FU actuator 250, may be solved by execution of the loop A a plurality of times.

[7.3 Effect]

According to the present embodiment, it is possible to perform EUV light centroid control in a wide range at a high speed while maintaining the control range of the actuator of the mirror holder 406. Thereby, in the EUV light emission position control accompanied by the EUV light centroid control, the moving speed of the EUV light emission position can be improved.

8. Others

It will be obvious to those skilled in the art that the technologies of the embodiments described above are applicable to each other including the modifications.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be had". Moreover, a modifier "one" or "a/an" described in the present description and in the accompanying claims should be construed to mean "at least one" or "one or more".

What is claimed is:

1. An extreme ultraviolet light generating apparatus in which a generation position of extreme ultraviolet light is moved based on an instruction from an external device, the apparatus comprising:
   a chamber in which a target fed into the chamber is irradiated with laser light so that the extreme ultraviolet light is generated from the target;
   a target feeder configured to output the target and feed the target into the chamber;
   a condensing mirror configured to condense the laser light on the target fed into the chamber;
   a stage configured to regulate a position of the target feeder;
   a manipulator configured to regulate a position of the condensing mirror; and
   a control unit configured to be able to control at least one of the stage, the manipulator, and a radiation timing of the laser light to the target, in a feedforward method, when the generation position is moved during generation of the extreme ultraviolet light.

2. The extreme ultraviolet light generating apparatus according to claim 1, further comprising
   a plurality of EUV light sensors configured to measure energy of the extreme ultraviolet light from different directions, wherein
   the control unit is configured to be able to perform EUV light centroid control, the EUV light centroid control being performed on the manipulator in a feedback method such that a centroid position of the extreme ultraviolet light calculated based on measurement results of the EUV light sensors comes to a given position, during generation of the extreme ultraviolet light.

3. The extreme ultraviolet light generating apparatus according to claim 2, wherein
   when the generation position is moved during generation of the extreme ultraviolet light, the control unit stops execution of the EUV light centroid control, and resumes execution of the EUV light centroid control after controlling at least one of the stage, the manipulator, and the radiation timing.

4. The extreme ultraviolet light generating apparatus according to claim 2, wherein
   in a case of controlling the manipulator when the generation position is moved during generation of the extreme ultraviolet light, the control unit controls the manipulator by performing the EUV light centroid control.

5. The extreme ultraviolet light generating apparatus according to claim 2, further comprising
   a target detection sensor configured to detect the target in a predetermined region in the chamber through which the target passes, after the target is output from the target feeder and before the target is irradiated with the laser light, wherein
   the control unit specifies a passage timing that is a timing when the target passes through the predetermined region, based on a detection result of the target detection sensor,
   the control unit causes a laser device to output the laser light at a timing when a delay time is added to the passage timing such that the target that passed through the predetermined region is irradiated with the laser light, and
   the control unit controls the radiation timing by changing the delay time.

6. The extreme ultraviolet light generating apparatus according to claim 5, wherein when the generation position is moved during generation of the extreme ultraviolet light, the control unit determines at least one of a driving amount of the stage, a driving amount of the manipulator, and a change amount of the delay time, based on a moving distance of the generation position according to the instruction, and the control unit controls at least one of the stage, the manipulator, and the radiation timing, according to at least one of the driving amount of the stage, the driving amount of the manipulator, and the change amount of the delay time determined.

7. The extreme ultraviolet light generating apparatus according to claim 6, wherein the extreme ultraviolet light is generated when plasma emits light including the extreme ultraviolet light, the plasma being generated from the target being irradiated with the laser light, the instruction includes a differential value between a plasma current position that is a current position of the plasma and a plasma target position that is the position of the plasma after being moved according to the instruction, the control unit estimates the position of the plasma as the generation position, and the control unit specifies the moving distance from the differential value.

8. The extreme ultraviolet light generating apparatus according to claim 7, wherein when the specified moving distance is equal to or smaller than an allowable value, the control unit determines at least one of the driving amount of the stage, the driving amount of the manipulator, and the change amount of the delay time, with use of the differential value, and when the specified moving distance is larger than the allowable value, the control unit determines at least one of the driving amount of the stage, the driving amount of the manipulator, and the change amount of the delay time, with use of the allowable value.

9. The extreme ultraviolet light generating apparatus according to claim 8, wherein when the specified moving distance is equal to or smaller than the allowable value, the control unit controls once at least one of the stage, the manipulator, and the radiation timing, and when the specified moving distance is larger than the allowable value, the control unit controls a plurality of times at least one of the stage, the manipulator, and the radiation timing.

10. The extreme ultraviolet light generating apparatus according to claim 9, further comprising an image sensor configured to capture an image of a region including a position of the target fed into the chamber, wherein the control unit specifies the plasma current position with use of the image captured by the image sensor, and the control unit sets a control objective position of the position of the target fed into the chamber, based on the specified plasma current position and the differential value.

11. The extreme ultraviolet light generating apparatus according to claim 10, wherein the control unit determines the driving amount of the stage by determining a change amount of the control objective position based on the specified moving distance.

12. The extreme ultraviolet light generating apparatus according to claim 11, wherein the image sensor includes:
 a first image sensor configured to capture an image of the target fed into the chamber, and
 a second image sensor configured to capture an image of a trajectory of the target fed into the chamber,
 the control unit measures the position of the target fed into the chamber with use of the images captured by the first image sensor and the second image sensor, and
 the control unit specifies the plasma current position by estimating the measured position of the target as the plasma current position.

13. The extreme ultraviolet light generating apparatus according to claim 11, wherein the image sensor includes a plurality of first image sensors configured to capture images of the plasma from different directions, the plasma being generated from the target fed into the chamber, the control unit measures the position of the plasma with use of the images captured by the first image sensors, and the control unit specifies the plasma current position from the measured position of the plasma.

14. The extreme ultraviolet light generating apparatus according to claim 1, further comprising:

a mirror provided on an optical path of pre-pulse laser light, the pre-pulse laser light being radiated to the target fed into the chamber and dispersing the target, the mirror being configured to reflect the pre-pulse laser light, and a mirror driving unit configured to drive the mirror, wherein the control unit performs high-speed centroid control to control a centroid position of the extreme ultraviolet light by driving the mirror by the mirror driving unit, and performs centroid auxiliary control to maintain the high-speed centroid control by driving the condensing mirror by the manipulator, and changes execution frequency of the high-speed centroid control and the centroid auxiliary control depending on response speed of the mirror driving unit and the manipulator.

* * * * *